(12) United States Patent
Sanari et al.

(10) Patent No.: US 9,753,189 B2
(45) Date of Patent: Sep. 5, 2017

(54) ANTI-REFLECTION SHEET WITH A RESIN LAYER INCLUDING A PLURALITY OF FINE PROJECTIONS, DISPLAY ELEMENT AND DISPLAY DEVICE INCLUDING THE SHEET

(71) Applicant: Soken Chemical & Engineering Co., Ltd., Tokyo (JP)

(72) Inventors: Kosuke Sanari, Otsu (JP); Yoshinori Ito, Moriyama (JP); Atsushi Okano, Nara (JP); Yoshihiko Takagi, Kyoto (JP)

(73) Assignee: Soken Chemical & Engineering Co., Ltd., Tokyo (JP)

( * ) Notice: Subject to any disclaimer, the term of this patent is extended or adjusted under 35 U.S.C. 154(b) by 455 days.

(21) Appl. No.: 14/097,999

(22) Filed: Dec. 5, 2013

(65) Prior Publication Data

US 2014/0092480 A1    Apr. 3, 2014

Related U.S. Application Data

(62) Division of application No. 12/676,727, filed as application No. PCT/JP2008/062748 on Jul. 15, 2008, now abandoned.

(30) Foreign Application Priority Data

Oct. 1, 2007    (JP) .................................. 2007-257951
Apr. 28, 2008    (JP) .................................. 2008-117593

(51) Int. Cl.
*G02B 27/00*    (2006.01)
*G02B 1/118*    (2015.01)
(Continued)

(52) U.S. Cl.
CPC ................ *G02B 1/118* (2013.01); *G02B 1/11* (2013.01); *H01L 51/5281* (2013.01); *G02F 1/133502* (2013.01); *G02F 1/133526* (2013.01)

(58) Field of Classification Search
CPC ....... B29D 11/0073; G02B 1/11; G02B 1/111; G02B 1/118; G02B 1/115; G02B 1/116;
(Continued)

(56) References Cited

U.S. PATENT DOCUMENTS

| 2006/0093964 | A1 | 5/2006 | Nagasaka et al. | |
| 2007/0116934 | A1* | 5/2007 | Miller | C25D 1/10 428/172 |

(Continued)

FOREIGN PATENT DOCUMENTS

JP    2005157119 A    *    6/2005

OTHER PUBLICATIONS

Office Action issued in U.S. Appl. No. 12/676,727, mailed on Mar. 20, 2013, 13 pages.
(Continued)

*Primary Examiner* — Jade R Chwasz
*Assistant Examiner* — Jyotsna Dabbi
(74) *Attorney, Agent, or Firm* — Osha Liang LLP

(57) ABSTRACT

An anti-reflection sheet includes a transparent substrate; and a resin layer formed on a surface of a transparent substrate. The resin layer includes a first surface that faces the surface of the transparent substrate; a second surface that faces away from the surface of the transparent substrate; and a plurality of projections arranged on the second surface of the resin layer so as to form a projection layer. Each of the plurality of projections has a cross section that includes an entire center axis perpendicular to the surface of the transparent substrate. Each of the plurality of projections has a cross section that is in a shape of quadratic function. An arranged pitch of each of the plurality of projections is not more than half of a wavelength of incident light. An aspect ratio of each of the plurality of projections is 1 or less. A difference between a refractive index n1 of the transparent substrate
(Continued)

and a refractive index n2 of the resin layer satisfies the following expression: $|n1-n2|\leq 0.05$. A thickness of the resin layer is 11 μm or more. The plurality of projections are shaped and arranged so as to satisfy a linear relationship between an effective refractive index of the projection layer and a height of the projection layer.

7 Claims, 24 Drawing Sheets

(51) Int. Cl.
*H01L 51/52* (2006.01)
*G02B 1/11* (2015.01)
*G02F 1/1335* (2006.01)

(58) Field of Classification Search
CPC ... G02B 1/12; G02B 1/14; G02B 1/16; G02B 1/10; G02B 1/105; G02B 1/113; G02B 5/285; G02B 5/28; G02B 5/0294; G02B 5/0278; G02B 5/045; G02B 6/29358; G02F 1/133502; G02F 2202/022; G02F 2202/023; G02F 2202/16; G02F 2202/22; B29C 47/0038; B31F 1/07
See application file for complete search history.

(56) References Cited

U.S. PATENT DOCUMENTS

| | | |
|---|---|---|
| 2007/0159698 A1 | 7/2007 | Taguchi et al. |
| 2007/0216997 A1 | 9/2007 | Noguchi et al. |
| 2009/0034082 A1* | 2/2009 | Commander ......... B41M 3/148 359/619 |

OTHER PUBLICATIONS

Office Action issued in U.S. Appl. No. 12/676,727, mailed on Oct. 9, 2012, 18 pages.

* cited by examiner (a)

(b)

ANTI-REFLECTION SHEET WITH A RESIN LAYER INCLUDING A PLURALITY OF FINE PROJECTIONS, DISPLAY ELEMENT AND DISPLAY DEVICE INCLUDING THE SHEET

CROSS-REFERENCE TO RELATED APPLICATIONS

The present application is a divisional application and thus claims benefit pursuant to 35 U.S.C. §121, of U.S. patent application Ser. No. 12/676,727 filed on Mar. 5, 2010, currently pending, which is a national stage application of PCT Application No. PCT/JP2008/062748, filed on Jul. 15, 2008, which claims priority from Japanese Patent Application No. 2007-257951 filed Oct. 1, 2007 and Japanese Patent Application No. 2008-117593 filed Apr. 28, 2008.

TECHNICAL FIELD

The present invention relates to an anti-reflection sheet, a display element and a display device. Specifically, the present invention relates to an anti-reflection sheet for preventing reflection of light in a specified wavelength band, and to a display element, such as an organic EL or liquid crystal display (LCD) panel, and a display device, the element and device having the anti-reflection sheet or sheets.

BACKGROUND ART

When external light such as sunlight or indoor illumination light reflects on a screen of a display device, contrast of the screen lowers, the screen becomes white and it becomes hard to view an image. In order to prevent such a phenomenon, an anti-reflection film has been conventionally proposed which is adhered to a surface of a display device and prevents reflection of external light.

Such an anti-reflection film is disclosed in, for example, Japanese Published Unexamined Patent Application No. 2002-122702 (Patent Document 1). The anti-reflection film is formed in a manner of bringing projections (protrusions), each which has a refractive index equivalent to that of a transparent film substrate, into close formation on a surface of the film substrate. The projection has a triangular cross section, that is, is in the shape of a pyramid (four-sided pyramid) or cone.

Such an anti-reflection film is sometimes provided, for use, on a surface of an outer face of equipment, for example, a surface of a transparent protective plate of a display device. When a surface of the anti-reflection film is rubbed with a soft cloth or cleaner to wipe sebaceous matter, dirt deposited on the surface of the anti-reflection film, the pyramid-shaped or conic projections are easily worn down and crushed, and an anti-reflection function of the anti-reflection film is easily impaired. Similarly, when the transparent protective plate is strongly pushed by a finger, the projections on the surface are crushed and the anti-reflection function is easily impaired.

Additionally, in the display device or the like, the anti-reflection film is sometimes adhered to a back face of the transparent protective plate or a display element under the back face. Also in this case, when the transparent protective plate is pushed by a finger or a touch pad pen, the transparent protective plate comes into contact with the display element, and thus, in some cases, the projections of the anti-reflection film are crushed by pressure, and the anti-reflection function of the anti-reflection film is lowered and impaired.

In order to solve the problems, in an anti-reflection film disclosed in Japanese Published Unexamined Patent Application No. 2004-70164 (Patent Document 2), nano-order projections are closely formed and micron-order protection poles higher than the height of the projections are scattered on a surface of the anti-reflection film. The protection poles protect the projections and prevent the projections from being damaged when the anti-reflection film is rubbed or pushed.

However, in the case where the anti-reflection film having such protection poles is provided on a surface of equipment, when the anti-reflection film is wiped with a soft cloth, feathered cloth or the like, the cloth or the like passes over the protection poles and comes into contact with the projections of the anti-reflection film, and the projections are destroyed. Additionally, also in the case where the anti-reflection film is provided on an inner face of a display device or the like, there is a possibility that the protection poles are damaged depending on the height of the protection poles or in the method of applying force.

Additionally, in the anti-reflection film disclosed in Patent Document 2, a reflectance of light becomes large owing to the protection poles thereby impairing a low reflectance property of the anti-reflection film, and a haze value becomes large owing to the protection poles thereby making an optical property poor. Additionally, in the case where the anti-reflection film having the micron-order protection poles thereon is used for a high-definition display device, the protection poles are viewed through a screen thereby causing a defect on an image.

[Patent Document 1] Japanese Published Unexamined Patent Application No. 2002-122702
[Patent Document 2] Japanese Published Unexamined Patent Application No. 2004-70164

DISCLOSURE OF THE INVENTION

Problems to be Solved by the Invention

The present invention has been made in view of the above technical problems and aims to provide an anti-reflection sheet capable of improving wear-resistance and pressure-resistance of projections without lowering optical properties, such as a low reflectance and a low haze value, of the anti-reflection sheet.

Means for Solving the Problems

In order to achieve the above object, in an anti-reflection sheet according to the present invention, a resin layer, in which a plurality of fine projections or recesses are arranged, is formed on a surface of a transparent substrate, the projections or recesses having a shape of a cross section which is in the shape of a quadratic function having a correlation coefficient of 0.8 or more, the cross section including a center axis perpendicular to the surface of the substrate, and an arranged pitch of the projections or recesses is not more than half of a wavelength of incident light. Here, the quadratic function-shaped cross section shows that a borderline between the projections or recesses and an air layer in the cross section of the projections or recesses is in the shape of a curve represented by a quadratic function. Moreover, the substrate may be made of hard resin, or may be a thin soft film substrate.

Since the plurality of fine projections or recesses are formed on the surface of the substrate in the anti-reflection sheet of the present invention, reflection of light on the surface of the substrate is suppressed and light incident to an anti-reflection film can be prevented from reflecting. When the arrangement pitch of the projections or recesses is more than half of a wavelength of incident light (the minimum wavelength in the case where a wavelength band of the incident light is wide), light largely reflects on the surface of the anti-reflection sheet, a haze value becomes large, coloring is caused by diffraction, and thus optical properties of the anti-reflection sheet become poor. Therefore, the arrangement pitch of the projections or recesses is here set so as to be not more than half of the wavelength of incident light.

Additionally, in the anti-reflection sheet of the present invention, since the shape of the cross section, which includes the center axis perpendicular to the surface of the substrate, of the projections or recesses is in the shape of the quadratic function having a correlation coefficient of 0.8 or more, a tip of the projections or recesses is not pointed differently from that of a pyramid-shaped or conic projection or recess, wear-resistance and pressure-resistance are improved and wear and damage do not easily occur. Additionally, since the shape of the cross section of the projections or recesses is in the shape of the quadratic function having a correlation coefficient of 0.8 or more, preferred optical properties equivalent to those of the pyramid-shaped projection or recess can be obtained.

The projections or recesses of an anti-reflection sheet according to an embodiment of the present invention have a quadratic function-shaped cross section including the center axis perpendicular to the surface of the substrate.

In the embodiment, since the cross section, which includes the center axis perpendicular to the surface of the substrate, of the projections or recesses is in the shape of the quadratic function (in the case where a correlation coefficient of the quadratic function is 1 and the cross section is almost in the shape of a quadratic function), the projections or recesses do not easily wear down or damage, and optical properties equivalent to those of the pyramid-shaped projections or recesses can be obtained. In these points, an effect of the present invention is clearly shown in the embodiment.

In an anti-reflection sheet according to another embodiment of the present invention, an aspect ratio of the projections or recesses is 1 or less. When the aspect ratio of the projections or recesses is set to 1 or less as the embodiment, wear-resistance and pressure-resistance of the anti-reflection sheet is remarkably raised, and the projections or recesses become more difficult to crush even if the anti-reflection sheet is rubbed or partially pressed.

In an anti-reflection sheet according to still another embodiment of the present invention, an area occupancy rate of the projections or recesses to an area of the surface of the substrate is 60% or more, viewed in a direction perpendicular to the surface of the substrate. When an area occupancy rate of the projections or recesses is less than 60%, the rate of a region, in which neither projections nor recesses are provided, becomes large and an anti-reflection effect at a level necessary for practical use cannot be obtained.

In an anti-reflection sheet according to still another embodiment of the present invention, a difference between a refractive index n1 of the substrate and a refractive index n2 of the projections or recesses satisfies the following expression:

$$|n1-n2| \leq 0.05$$

Particularly, it is desirable that the refractive index n1 of the substrate is equivalent to the refractive index n2 of the projections or recesses. When the difference between the refractive index n1 of the substrate and the refractive index n2 of the projections or recesses is more than 0.05, light largely reflects on an interface between the substrate and the projections or recesses and a function of the anti-reflection sheet is impaired.

In an anti-reflection sheet according to still another embodiment of the present invention, the difference between the refractive index n1 of the substrate and the refractive index n2 of the resin layer having the projections or recesses satisfies the following expression:

$$|n1-n2| \leq 0.02$$

According to the embodiment, by lowering a reflectance of the interface between the substrate and the resin layer, the intensity of an interference fringe is lowered and the interference fringe can be made invisible.

In an anti-reflection sheet according to still another embodiment of the present invention, the height of the projection or the depth of the recess is 400 nm or less. Further, in this embodiment, it is desirable that the height of the projection or the depth of the recess is 50 nm or more. When the height of the projection or the depth of the recess is more than 400 nm, the strength of the projections or recesses becomes small and wear-resistance and pressure-resistance become poor. Additionally, when the height of the projection or the depth of the recess is less than 50 nm, the reflectance becomes large and the function of the anti-reflection sheet is impaired in the case of visible light.

In an anti-reflection sheet according to still another embodiment of the present invention, the thickness of the resin layer having the projections or recesses is 11 μm or more. According to the embodiment, light reflecting on a surface of the resin layer and light reflecting on a backside of the layer can be prevented from generating an interference fringe.

In an anti-reflection sheet according to still another embodiment of the present invention, the projections or recesses have a shape rotationally symmetric around the center axis perpendicular to the surface of the substrate. Additionally, the projections or recesses may be not rotationally symmetric around the center axis but anisotropic.

Additionally, the projections or recesses of the anti-reflection sheet of the present invention may be formed on a face, which is arranged toward an observer, of the substrate, or formed on the face, which is arranged toward an observer, and a face opposite thereto of the substrate. Since the projections and recesses are not easily crushed and are durable even if the anti-reflection sheet of the present invention is rubbed or pressed, a light anti-reflection function is not easily impaired even if the projections or recesses are formed on the face, which is arranged toward an observer, of the substrate. Additionally, when the projections or recesses are formed on both the face, which is arranged toward an observer, and the face opposite thereto of the substrate, the anti-reflection effect is further improved.

In an anti-reflection sheet according to still another embodiment of the present invention, the substrate has an adhesive layer on its face opposite to the face on which the resin layer is formed, and a difference between the refractive index n1 of the substrate and a refractive index n3 of the adhesive layer satisfies the following expression:

$$|n1-n3| \leq 0.02$$

According to the embodiment, by lowering a reflectance of an interface between the substrate and the adhesive layer and lowering the intensity of an interference fringe, the interference fringe can be made difficult to view.

In a display element according to the present invention, the anti-reflection sheet is provided on a surface of a display panel. Since the display element includes the anti-reflection sheet of the present invention, external light such as sunlight or indoor illumination light is not easily reflected, contrast of a screen is kept, and visibility can be made excellent. Further, since the anti-reflection sheet has wear-resistance and pressure-resistance, external force does not easily impair the function of the anti-reflection sheet.

A display device according to the present invention includes a display panel and a transparent protective plate arranged opposite to a face on an image generation side of the display panel, and the anti-reflection sheet is provided on at least one of both front and back faces of the transparent protective plate. Since the display device includes the anti-reflection sheet of the present invention, external light such as sunlight or indoor illumination light is not easily reflected, contrast of a screen is kept and visibility can be made excellent. Further, since the anti-reflection sheet has wear-resistance and pressure-resistance, external force does not easily impair the function of the anti-reflection sheet.

Moreover, the above-described components are properly combined as means of the present invention for solving the above problems, and the present invention can provide many variations by combining the components.

DESCRIPTION OF REFERENCE NUMERALS

Figure 1:
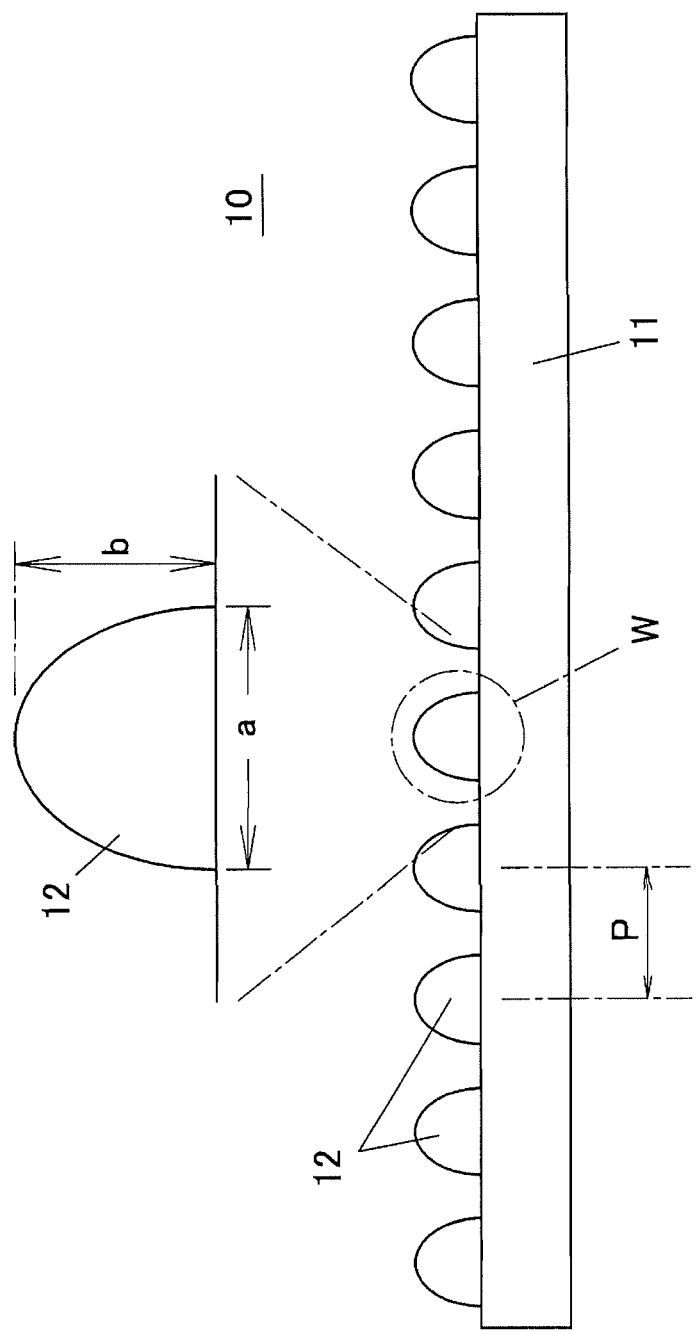
FIG. 1 is a schematic cross sectional view showing an anti-reflection sheet according to a first embodiment of the present invention.

10: Anti-reflection sheet
11: Substrate
12: Projection
16: Recess
18: Liquid crystal display panel
19: Protective cover
21: Division region
22: Pole body
23: Resin layer

BEST MODES FOR CARRYING OUT THE INVENTION

Hereinafter, preferred embodiments of the present invention will be described with reference to the accompanying drawings.

First Embodiment

Figure 2:
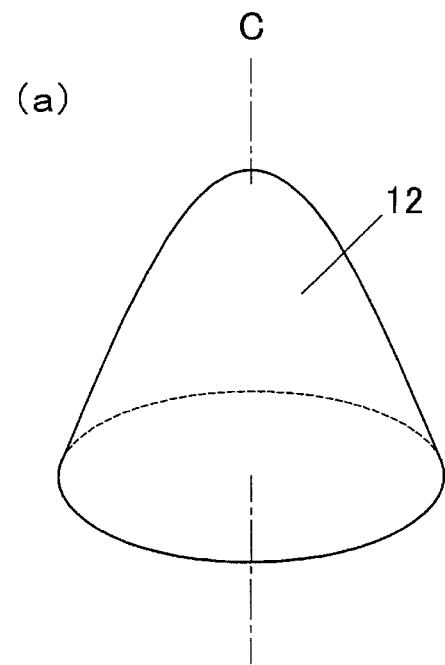
FIG. 2(a) is a perspective view showing one shape of a projection provided on a surface of the anti-reflection sheet.
FIG. 2(b) is a perspective view showing another shape of the projection.
Figure 2:
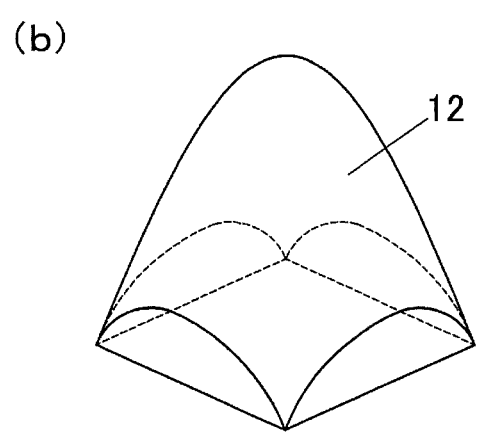

FIG. 1 is a schematic cross sectional view showing an anti-reflection sheet according to a first embodiment of the present invention, and FIG. 1 further shows an enlarged W portion thereof. FIG. 2(a) is a perspective view showing one shape of a projection provided on a surface of the anti-reflection sheet, and FIG. 2(b) is a perspective view showing another shape of the projection. FIG. 3(a) is a schematic plan view showing one example of arrangement of projections on a surface of a substrate, FIG. 3(b) is a schematic plan view showing another example of the arrangement of the projections, and FIG. 3(c) is a schematic plan view showing still another example of the arrangement of the projections.

As shown in FIG. 1, an anti-reflection sheet 10 is formed in a manner of bringing many transparent fine projections 12 (resin layer composed of only projections) into close formation on a flat and smooth surface of a transparent substrate 11. However, the projection 12 is shown exaggeratedly large in FIG. 1. The substrate 11 is formed by molding transparent resin having a high refractive index, for example, polycarbonate resin, acryl resin or the like into a plate shape. The substrate 11 may be a hard resin substrate, or a thin soft film substrate, and can have any thickness.

The projection 12 formed on the surface of the substrate 11 has a shape rotationally symmetric around a center axis C perpendicular to the surface of the substrate, and a shape of a cross section including the center axis C is in the shape of a quadratic function, as shown in FIG. 2(a). That is, a surface of the projection 12 is a rotational paraboloid. A bottom of the projection 12 may be circular as shown in FIG. 2(a), may be square as shown in FIG. 2(b), or may be triangular or polygonal such as five or more-cornered. In order to make a shape of the bottom of the projection 12 not circular but, for example, square, foot portions of the projection 12 having the circular bottom may be cut along perpendicular faces as shown in FIG. 2(b).

Now, as shown in FIG. 1, the height of the projection 12, which is a rotational paraboloid body, is represented as b, and the width (diameter) of the bottom is represented as a. Here, a z-axis is set in a direction of the center axis C of the projection 12, an r-axis is set so as to be parallel with the bottom of the projection 12 and cylindrical coordinates are assumed which have a cross point of the center axis C and the bottom as an origin. A surface shape of the projection 12 is expressed by the following expression having the two parameters a and b:

$$Z=b-[2(\sqrt{b})r/a]^2$$

However, $a \neq 0$, $b \neq 0$

A ratio of the height b and the width a is called aspect ratio b/a in this case. It is desirable that the aspect ratio of the projection 12 satisfies the following condition:

$$b/a \leq 1 \quad \text{(Condition 1)}$$

Additionally, since a lower limit value of the height b of the projection 12 is 50 nm and the maximum arrangement pitch of the projections 12 to visible light is 400 nm as described below, a lower limit value of the aspect ratio b/a is 1/8 (50 nm/400 nm). However, in the case where incident light including a range of infrared light is considered, the lower limit value of the aspect ratio b/a is 1/12 (50 nm/600 nm).

It is preferable that the height b of the projection 12 satisfies the following condition:

$$50 \text{ nm} \leq b \leq 400 \text{ nm} \quad \text{(Condition 2)}$$

Since the maximum value of an arrangement pitch P of the projections 12 is 400 nm as described below, the maximum value of the width a is also 400 nm. Additionally, since the minimum value of the height b is 50 nm and the aspect ratio b/a is 1 or less, the minimum value of the width a is also 50 nm.

When a refractive index n1 of the substrate 11 is different from a refractive index n2 of the projection 12, light reflects on an interface between the substrate 11 and the projection 12. Therefore, it is most desirable that the refractive index n1 of the substrate 11 is equivalent to the refractive index n2 of the projection 12, but a difference between the refractive indexes is permissible if satisfying the following condition:

$$|n1-n2| \leq 0.05 \quad \text{(Condition 3)}$$

Reasons for the conditions will be described below.

Moreover, the width a of the bottom of the projection 12 is fixed regardless of measuring directions if the bottom of the projection 12 is circular as shown in FIG. 2(a). However, the widths of the bottom in a diagonal direction and a direction parallel with a side are different from each other in the projection 12 having the square bottom as shown in FIG. 2(b). When the bottom is not circular, it is allowed to consider a rotational paraboloid with no deficiency corresponding to the projection 12 and set the width of the bottom of the paraboloid as a. Therefore, when the bottom is square, the width in the diagonal direction may be set as the width a of the projection 12.

The projections 12 are formed on the surface of the substrate 11 by a stamper method with use of transparent ultraviolet curable resin, for example, ultraviolet curable polycarbonate resin, ultraviolet curable acrylic resin or the like. That is, portions having shapes reverse to those of many projections 12 are provided on a stamper (not shown). After ultraviolet curable resin is applied to the surface of the substrate 11, the ultraviolet curable resin is pressed by the stamper from above so as to be molded between the substrate 11 and the stamper, and in this state, and ultraviolet ray is irradiated to the ultraviolet curable resin so as to cure the resin. When the stamper is peeled off after curing of the ultraviolet curable resin, the ultraviolet curable resin is molded into many projections 12 on the surface of the substrate 11.

Figure 3:
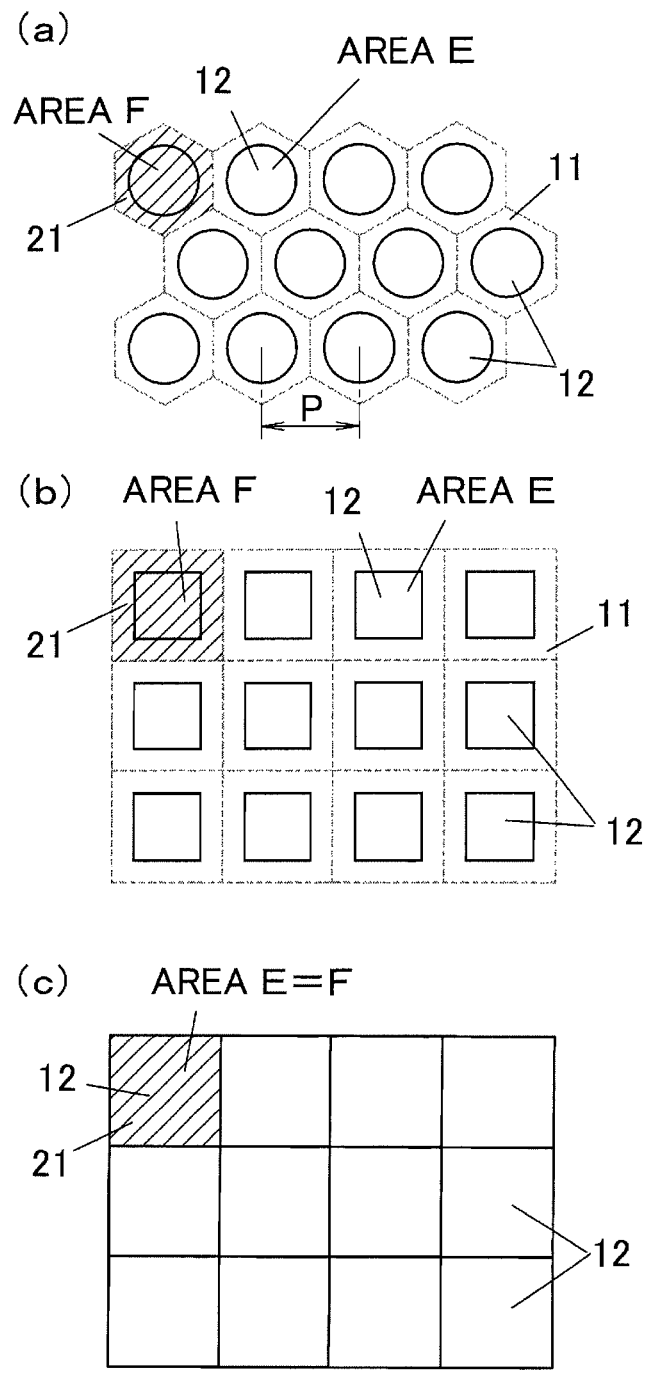
FIG. 3(a) is a schematic plan view showing one example of arrangement of projections on a surface of a substrate.
FIG. 3(b) is a schematic plan view showing another example of the arrangement of the projections.
FIG. 3(c) is a schematic plan view showing still another example of the arrangement of the projections.

The thus formed projections 12 may be arranged in a honeycomb shape (delta arrangement) on the surface of the substrate as shown in FIG. 3(a), or arranged in a rectangular shape as shown in FIG. 3(b). Gaps may be provided between the projections 12 as shown in FIGS. 3(a) and (b), or the projections 12 may come into close contact with each other without gaps as shown in FIG. 3(c). However, when the projections 12 are arranged with gaps, it is desirable that an area occupancy rate is 60% or more (Condition 4). Here, the area occupancy rate indicates a percentage of an area E of the bottom of the projection 12 to an area F of a region surrounded by border lines each passing the center of the gap between the projections 12 (hereinafter, the region will be referred to as division region 21, and the area F is an area which is a shaded portion of the division regions 21 in FIG. 3), the border lines being indicated by broken lines in FIGS. 3(a) and (b). That is, the area occupancy rate is represented by (E/F)×100%. Moreover, when no gap is provided between the projections 12 as shown in FIG. 3(c), the area occupancy rate is 100%.

Additionally, it is desirable that the arrangement pitch P of the projections 12 is not more than half of a wavelength λ of incident light (or the minimum wavelength in the case where a wavelength band of the incident light is wide) to be prevented, by the anti-reflection sheet 10, from reflecting. Accordingly, in the anti-reflection sheet 10 for preventing reflection of visible light, the arrangement pitch P of the projections 12 is required to satisfy the following condition:

$$50 \text{ nm} \leq P \leq 400 \text{ nm}$$

Here, regarding the arrangement pitch P, a distance between the projections 12 may be considered when the projections 12 are arranged in the honeycomb shape as shown in FIG.

3(a), and the average value of distances between the projections 12 may be considered when the projections 12 are arranged at random.

When the pitch P of the projections 12 is more than half of the incident light wavelength λ, the light largely reflects on the surface of the anti-reflection sheet, a haze value becomes large, coloring is caused by diffraction and optical properties of the anti-reflection sheet become poor. Therefore, it is desirable that the pitch P of the projections 12 is not more than half of the incident light wavelength λ. Additionally, in the case where visible light is made incident, if a wavelength band of the visible light is set to, for example, 400 nm to 800 nm, the pitch P of the projections 12 may be set to 400 nm or less in the case of preventing the visible light of a maximum wavelength of approximately 800 nm from reflecting, and may be set to 200 nm or less in the case of preventing all visible light from reflecting.

Additionally, since the lower limit value of the height b of the projection 12 is 50 nm, a lower limit value of the arrangement pitch P of the projections 12 is also 50 nm when the aspect ratio b/a is 1 or less.

Since each projection 12 of the anti-reflection sheet 10 of the present invention has the quadratic function-shaped cross section or is the rotational paraboloid body, a tip of the projection 12 is a curved face, and the projection 12 has greater wear-resistance and pressure-resistance than those of a pyramid-shaped or conic projection having a pointed tip. Therefore, even when the anti-reflection sheet 10 is rubbed with a cloth or cleaner, or pressed by a finger or a touch pad pen, the projection 12 is not easily destroyed, a low reflectance property or an anti-reflection effect of the anti-reflection sheet 10 is not easily impaired and lowered.

Figure 4:
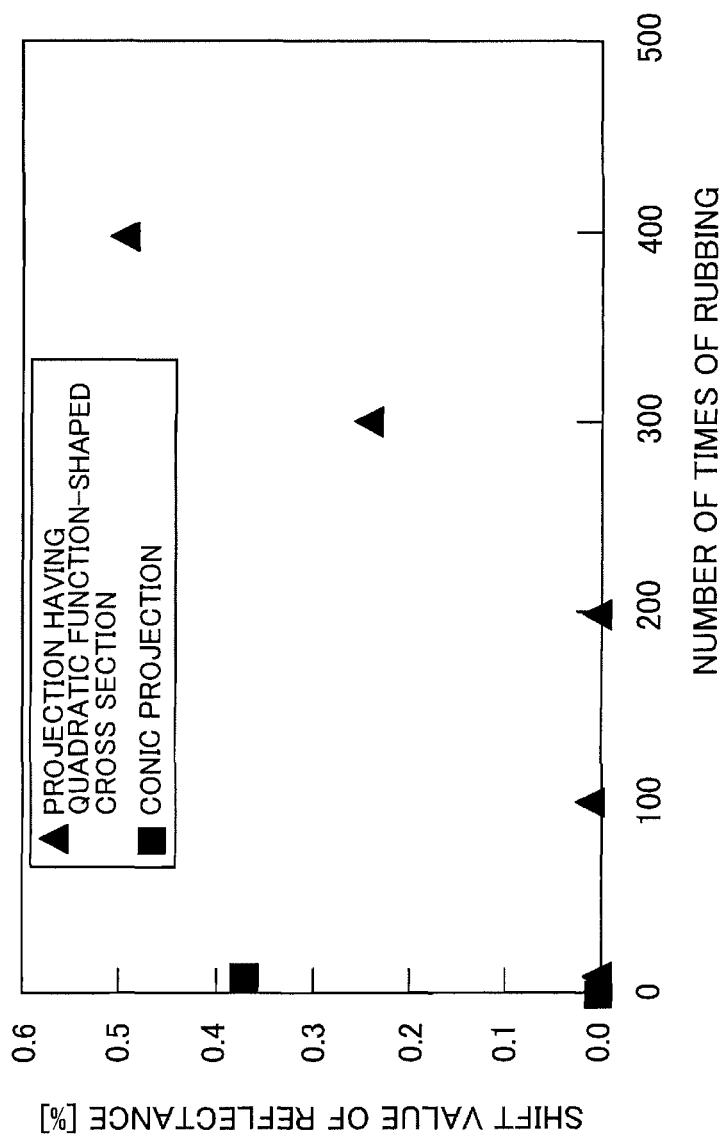
FIG. 4 is a graph showing the test results obtained by comparing wear-resistance of the anti-reflection sheet of the first embodiment having projections each having a quadratic function-shaped cross section with that of a conventional anti-reflection film having conic projections.

FIG. 4 is a graph showing test results obtained by comparing the wear-resistance of the anti-reflection sheet 10 of the present invention having projections 12 each having the quadratic function-shaped cross section with that of a conventional anti-reflection film having conic projections. The projection 12 used for the anti-reflection sheet 10 of the present invention is a rotational paraboloid body having a width a of 200 nm and a height b of 170 nm and has a circular bottom (the aspect ratio is 0.85), as shown in FIG. 5(a). On the other hand, a projection 102 used for the conventional anti-reflection film is in the shape of a cone having a width a of 200 nm and a height b of 500 nm and has a circular bottom (the aspect ratio is 2.5), as shown in FIG. 5(b). A difference between the heights b or aspect ratios b/a of the projection 12 of the present invention and the projection 102 of the conventional anti-reflection film is caused because designing is performed so that a reflectance of the anti-reflection sheet 10 of the present invention is equivalent to that of the conventional anti-reflection film. Additionally, the projections were delta-arranged at an arrangement pitch P of 230 nm in both the anti-reflection sheet 10 of the present invention and the conventional anti-reflection film (see FIG. 3(a)).

The test of wear-resistance was performed in a manner of rubbing the surface of the anti-reflection sheet 10 or a surface of the anti-reflection film with a cleaner (paper) impregnated with ethanol and measuring the change in the reflectance of the anti-reflection sheet 10 or anti-reflection film. FIG. 4 shows the test results, the horizontal axis in FIG. 4 represents the number of times of rubbing (scratching frequency) with the cleaner, and the vertical axis represents a difference (shift value of reflectance) between the reflectances before and after rubbing. Regarding the conventional anti-reflection film (having the conic projections), the reflectance largely changed only by rubbing approximately 10 times. However, regarding the anti-reflection sheet 10 of the present invention (having the projections each having the quadratic function-shaped cross section), the reflectance did not change even after rubbing 200 times. Accordingly, from the test results, it is understood that by forming the shape of the projection 12 into the quadratic function-shaped cross section as in the anti-reflection sheet 10 of the present invention, the wear-resistance of the anti-reflection sheet 10 is greatly improved with no change in the optical property (reflectance) from the conventional anti-reflection film.

According to the test results in FIG. 4, regarding the projection 12 having a quadratic function-shaped cross section and an aspect ratio b/a of 0.85, the reflectance of the anti-reflection sheet 10 does not change until the scratching frequency reaches 200, but largely changes when the scratching frequency reaches 300. The scratching frequency with the cleaner for giving no change to the reflectance is at least 200 in this case, and a maximum value of the scratching frequency for thus giving no change to the reflectance is referred to as wear-resistance frequency.

Table 1 shown below shows results obtained by changing the aspect ratio b/a of the projection 12 having the quadratic function-shaped cross section (changing the height b) and measuring the wear-resistance frequency.

TABLE 1

| aspect ratio b/a | wear-resistance frequency (number of times) |
| --- | --- |
| 2.5 | 75 |
| 2.0 | 100 |
| 1.5 | 100 |
| 1.25 | 150 |
| 1.0 | 200 |
| 0.85 | 200 |

From Table 1, it is understood that the wear-resistance frequency becomes large as the aspect ratio b/a becomes small. As described above, when the shape of the projection 12 is formed into the quadratic function-shaped cross section, the aspect ratio can be made smaller than that of the conic projection or the like without degrading the optical properties. Accordingly, it is understood that the wear-resistance can be remarkably raised by adopting the projection 12 having the quadratic function-shaped cross section. Particularly, when the aspect ratio b/a of the projection 12 is 1 or less, the wear-resistance frequency becomes extremely large. Accordingly, as indicated in Condition 1, it is desirable that the aspect ratio b/a of the projection 12 is 1 or less. On the other hand, as indicated by the fact that a reflectance of the projection 12 having an aspect ratio b/a of 1 is equivalent to that of a conic projection having an aspect ratio b/a of 2.5, the reflectance of the anti-reflection film becomes extremely large when the aspect ratio of the conic projection is 1 or less.

Figure 5:
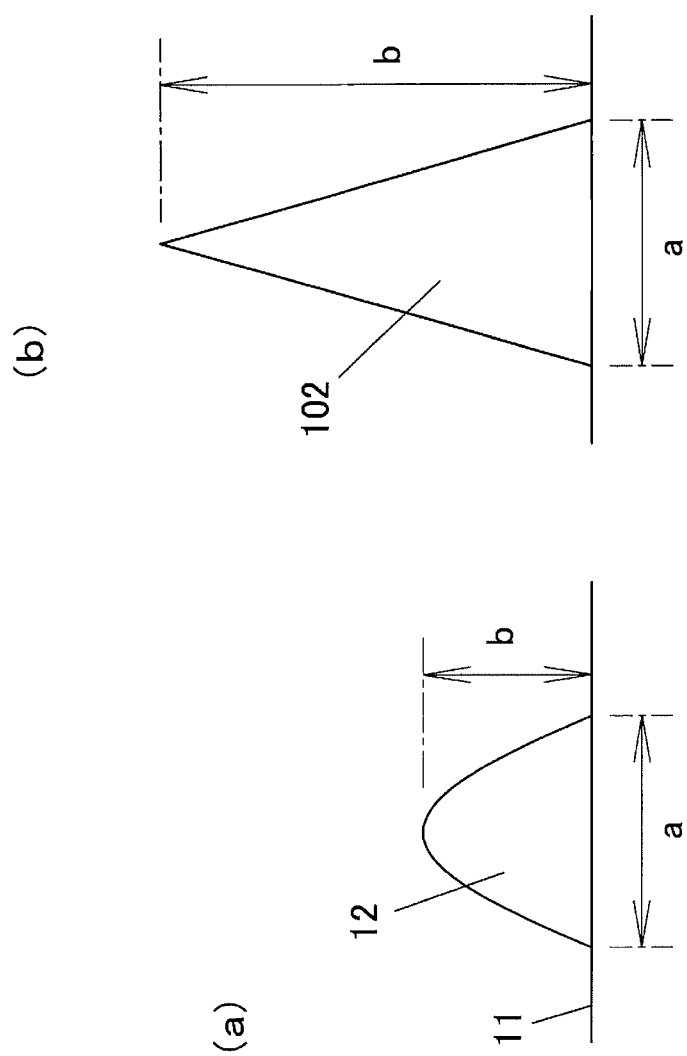
FIG. 5(a) is a side view showing a projection having a quadratic function shaped cross section.
FIG. 5(b) is a side view showing a conic projection, the projection being used for obtaining the test results shown by FIG. 4.
Figure 6:
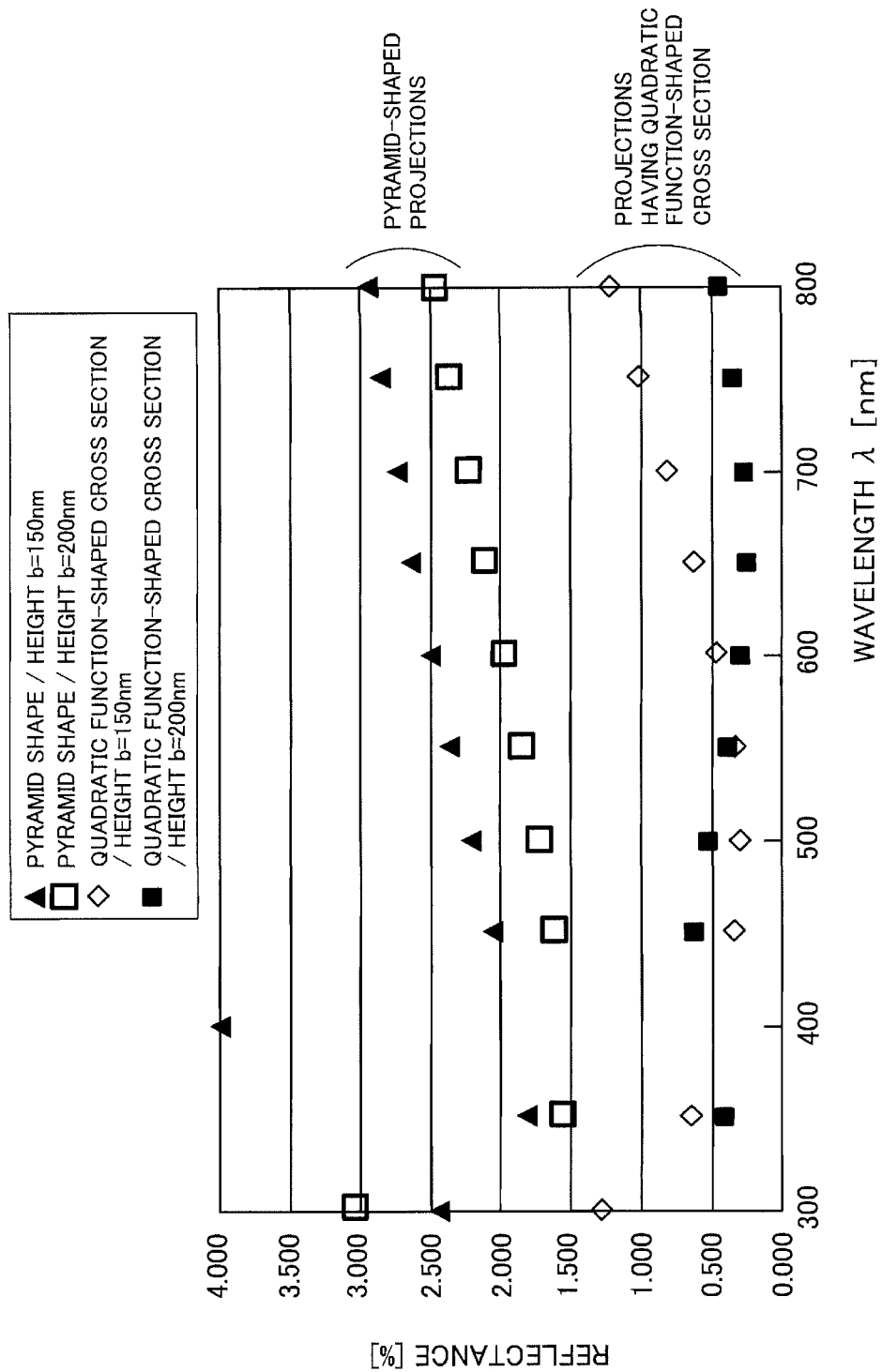
FIG. 6 is a graph showing a comparison result of reflectances of an anti-reflection film having pyramid-shaped projections and the anti-reflection sheet having the projections each having the quadratic function-shaped cross section.

Additionally, if noting a difference between sizes of the projection 12 of the present invention and the projection 102 of the conventional anti-reflection film shown in FIG. 5, it is also understood that the aspect ratio of the projection having the quadratic function-shaped cross section can be remarkably smaller than that of the conventional conic projection if the reflectances of both the projections are equivalent to each other. This is also shown in simulation results shown in FIG. 6. FIG. 6 shows the simulation results of a relationship between the wavelength λ and reflectance of perpendicularly incident light to the anti-reflection sheet. In the anti-reflection sheet used here, projections were delta-arranged so that the area occupancy rate of the projections each having a refractive index n2 of 1.48 to a surface of a substrate having a refractive index n1 of 1.48 is 70%. As samples of the projections, the following projections were adopted: pyramid-shaped projections having a width a of 100 nm and heights b of 150 nm and 200 nm; and projections having a width a of 100 nm and heights b of 150 nm and 200 nm, and each having a square bottom and a quadratic function-shaped cross section (see FIG. 2(b)).

From FIG. 6, it is understood that by forming the shape of the projection into the quadratic function-shaped cross section, an anti-reflection sheet having a lower reflectance can be made even if the height b of the projection having the quadratic function-shaped cross section is smaller than that of the pyramid-shaped projection.

Figure 7:
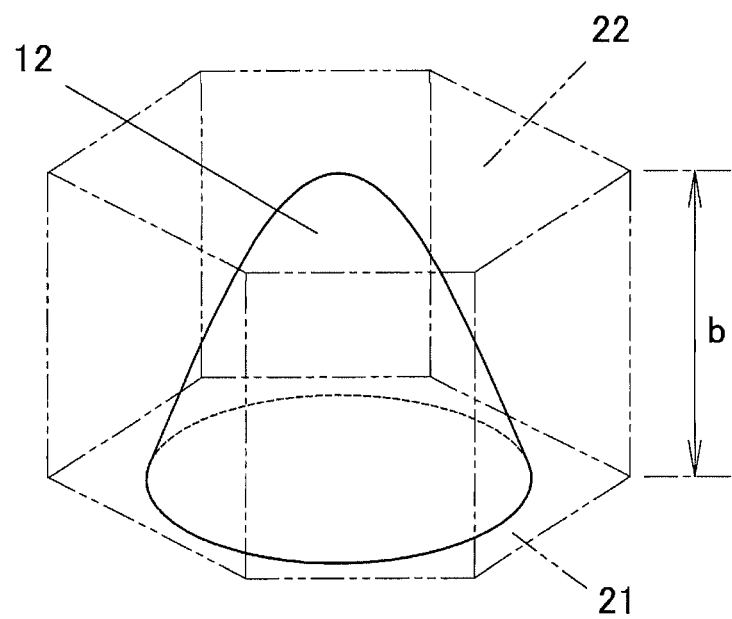
FIG. 7 is a view for explaining an effective refractive index.

Next, as one of the optical properties, an effective refractive index was examined. First, the effective refractive index of the anti-reflection sheet will be described. As shown in FIG. 7, when considering a pole body 22 having a bottom, which is the division region 21 (shaded portions in FIG. 3), and a height equivalent to that of the height b of the projection 12, the projection 12 is located inside of the pole body 22. An average refractive index of the pole body 22, in which the projection 12 having the refractive index n2 is thus located, is called effective refractive index N. That is, the effective refractive index is expressed by the following expression:

$$N=[n2 \times V2+n3 \times (V3-V2)]/V3$$

wherein n2 and V2 represent the refractive index and volume of the projection 12, respectively, V3 represents the volume of the pole body 22 and n3 (=1) represents a refractive index of an air layer.

Figure 8:
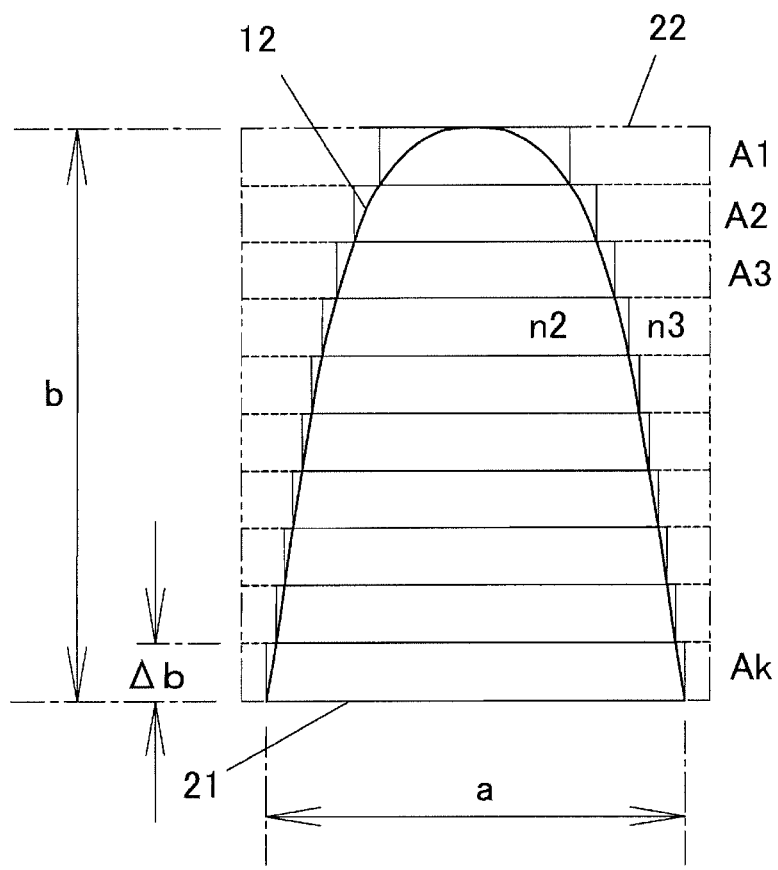
FIG. 8 is a view for explaining an effective refractive index.

Specifically, the effective refractive index N of the projection 12 was calculated as shown in FIG. 8. After the pole body 22 was first defined as shown in FIG. 7, the pole body 22 was divided by horizontal faces at specified intervals (thicknesses) Δb into k layers, A1, A2, . . . , Ak as indicated by broken lines in FIG. 8. Next, the projections 12 were approximated to columns in the layers A1, A2, . . . , Ak as indicated by thin solid lines in FIG. 8. Then, the effective refractive indexes of the layers A1, A2, . . . , Ak were calculated. For example, when a bottom area of the column in the uppermost layer A1 is represented as G1 and a bottom area of the pole body 22 is represented as F, an effective refractive index N1 of the layer A1 is obtained by the following expression:

$$N1=[n2 \times G1+n3 \times (F-G1)]/F$$

After the effective refractive indexes N2, N3, . . . , Nk of the layers A2, A3, . . . , Ak were similarly calculated, the effective refractive index of the anti-reflection sheet 10 was calculated, as an average value, by the following expression:

$$N=(N1+N2+ \ldots +Nk)/k$$

Although a calculating method of the effective refractive index regarding the project ion 12 having the quadratic function-shaped cross section is described above, an effective refractive index regarding a projection having any shape can be similarly calculated.

Figure 9:
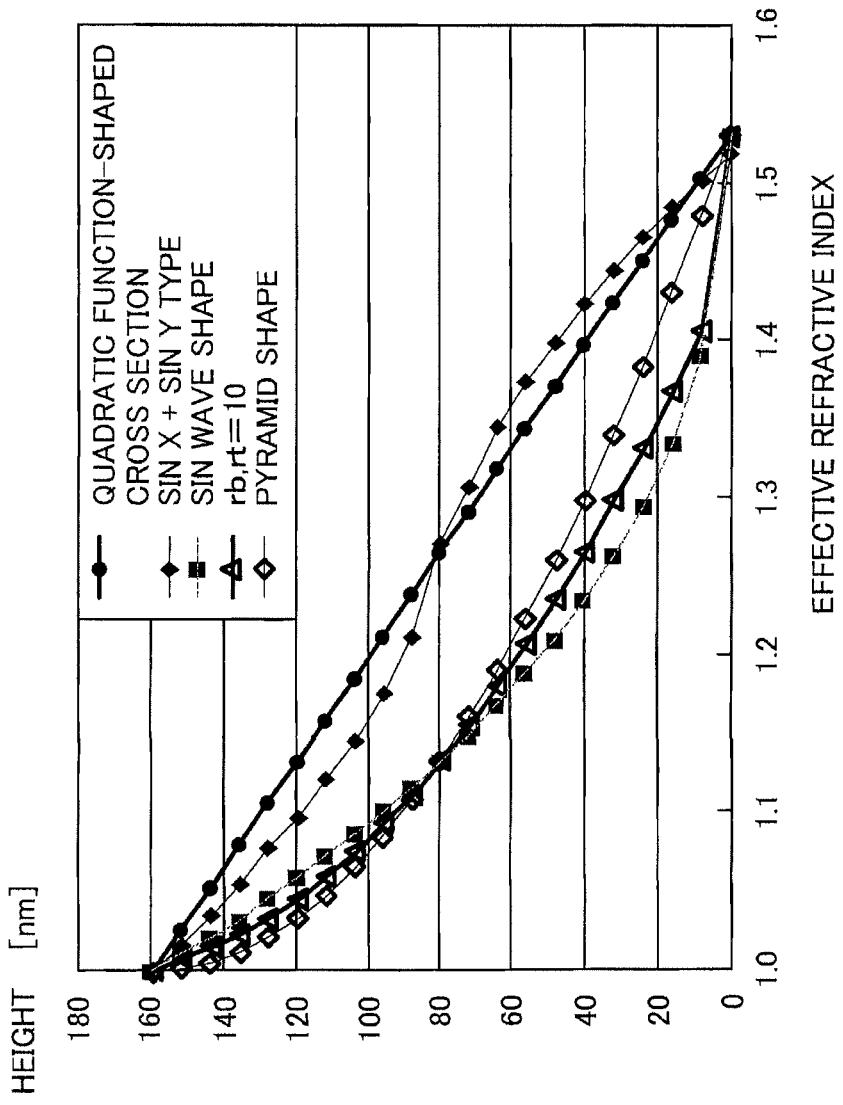
FIG. 9 is a graph showing a relationship between a height b and effective refractive index N of each of the projections having various shapes, the relationship being obtained by simulation.
Figure 10:
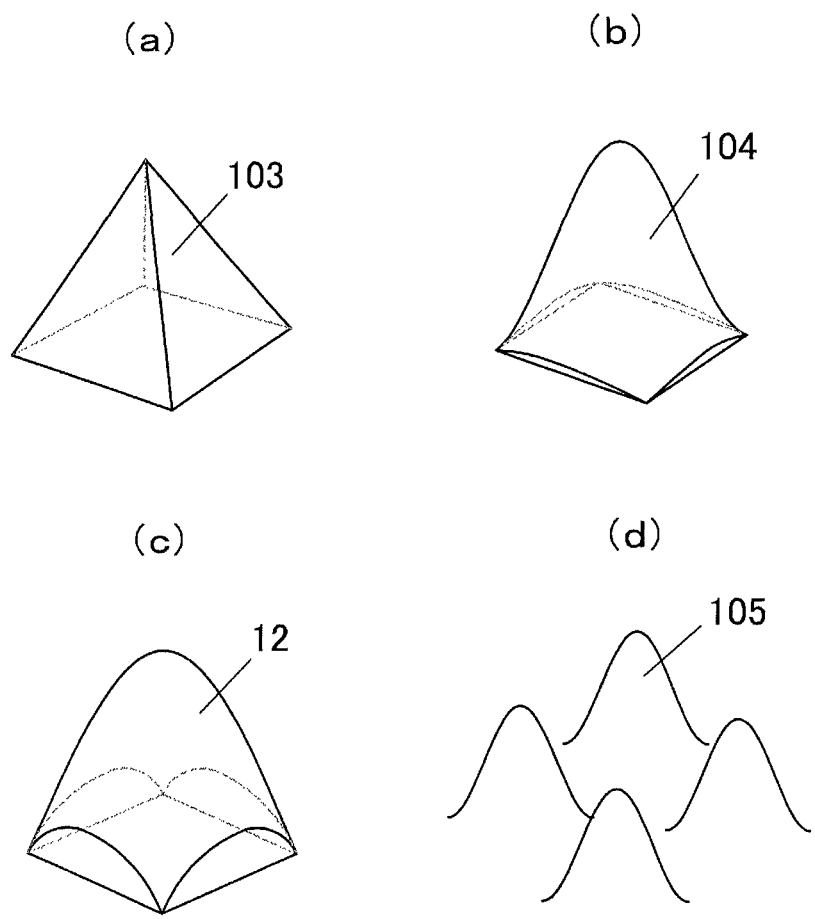
FIGS. 10(a), (b), (c) and (d) are schematic views showing shapes of the projections having the effective refractive indexes shown by FIG. 9.

FIG. 9 shows a relationship between a height in the projection and effective refractive index N regarding the projections having various shapes, the relationship being obtained by simulation. Here, as target projections, the following projections were adopted: a pyramid-shaped projection 103 shown in FIG. 10(a); a rotational body-shaped projection 104 in which a cross section including a center axis is in the shape of a sin wave as shown in FIG. 10(b); the projection 12 of the present invention having the quadratic function-shaped cross section (however, the bottom is square) as shown in FIG. 10(c); a sin X+sin Y type projection 105 shown in FIG. 10(d); and a projection, shown in FIG. 10(c), having a cross section which is in the shape of a quadratic function having a correlation coefficient of the quadratic function is 10 (shown as rb, rt=10 in FIG. 9). All the projections were arranged so that the area occupancy rate is 100%. Moreover, the sin X+sin Y type projection 105 shows a projection in which when an X-axis and a Y-axis orthogonal to each other in parallel with the surface of the substrate are defined, a height in plane coordinates (X, Y) is represented by sin X+sin Y. Moreover, the refractive index n2 of resin used for the projection was set to 1.52.

As understood from FIG. 9, effective refractive indexes of the sin wave-shaped projection 104, the sin X+sin Y type projection 105 and the projection having a correlation coefficient of 10 (rb, rt=10) do not linearly change similar to the effective refractive index of the pyramid-shaped projection 103 having optical properties considered optimum, but radically change and optical properties of the projections 104 and 105 and projection having a correlation coefficient of 10 become poor. On the other hand, in the case of the projection 12 having the quadratic function-shaped cross section, an effective refractive index is obtained which has a change property more linear than that of the pyramid-shaped projection 103 having optical properties considered optimum, and excellent optical properties are shown.

In the case of the projection 12 having the quadratic function-shaped cross section, the relationship between the height in the projection 12 and effective refractive index N is linear, and therefore the reflectance can be made small without making the aspect ratio b/a of the projection 12 large. Accordingly, according to the projection 12 having the quadratic function-shaped cross section, the wear-resistance and pressure-resistance can be raised, without lowering the optical properties, by making the aspect ratio 1 or less.

Figure 11:
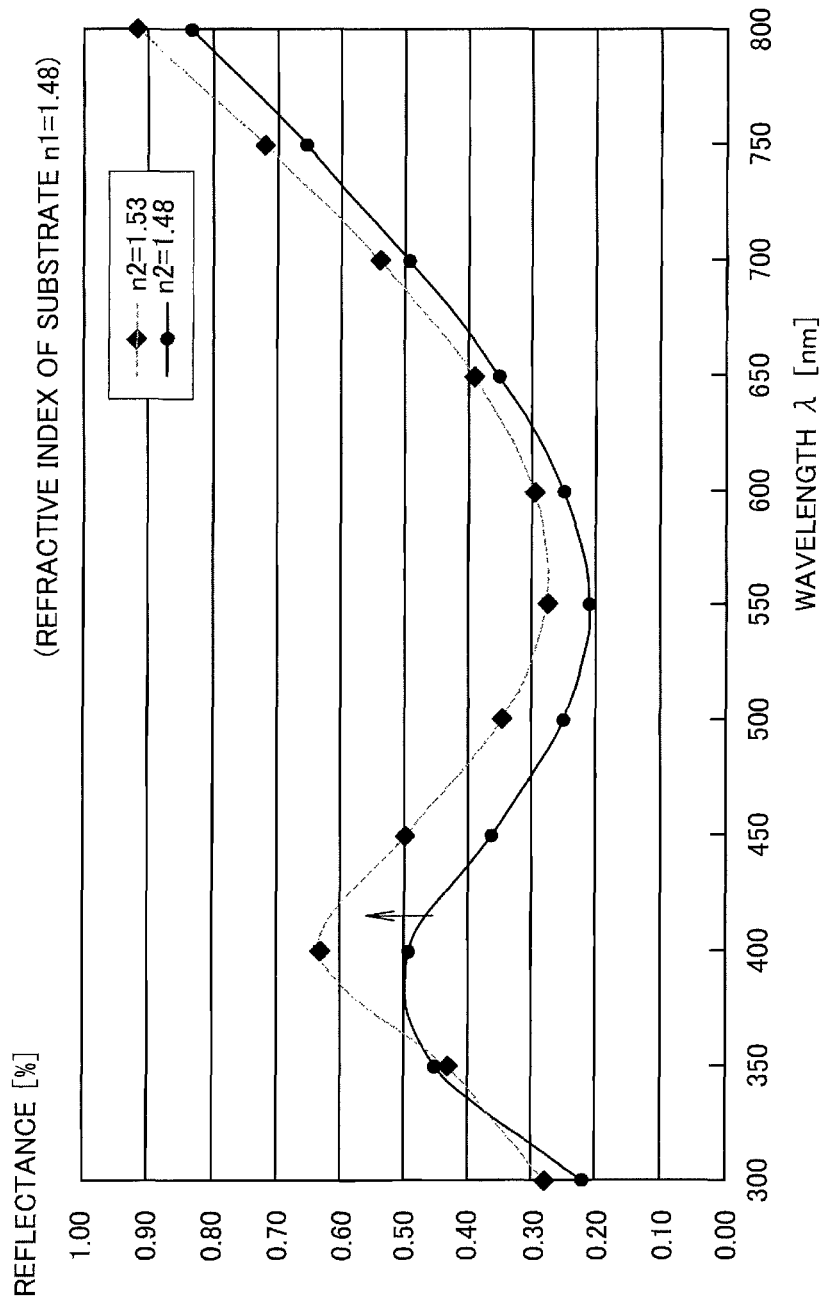
FIG. 11 is a graph showing the change in the reflectance when the refractive index n2 of the projection is changed from 1.48 to 1.53.

Next, the reason for Condition 3 will be described. FIG. 11 shows reflectances in visible light bands in cases where projections each having a refractive index n2 of 1.48 and a quadratic function-shaped cross section are formed on a surface of a substrate having a refractive index n1 of 1.48 and where projections 12 each having refractive index n2 of 1.53 and a quadratic function-shaped cross section are formed on the surface of the substrate having a refractive index n1 of 1.48. As shown in FIG. 11, when the refractive index n2 of the projection 12 is changed from 1.48 to 1.53 by 0.05, the reflectance changes by 0.10 or more at a place where the reflectance largely changes as indicated by the arrow in FIG. 11. Since a problem is caused in practical use when the reflectance rises by 0.10 or more, it is desirable that the difference between the refractive index n1 of the substrate 11 and refractive index n2 of the projection 12 is 0.05 or less as indicated by Condition 3.

Figure 12:
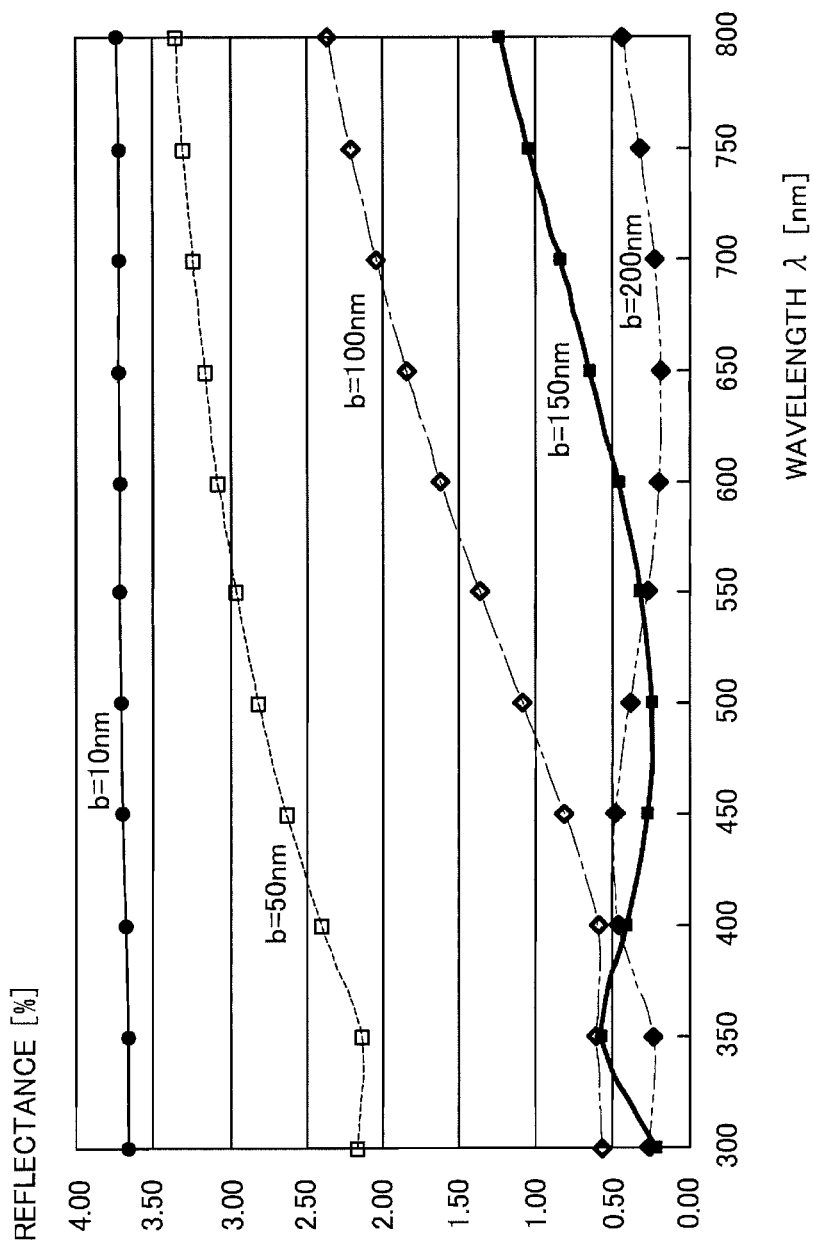
FIG. 12 is a graph showing the change in the reflectance when the height of the projection is changed.

Next, the reason for Condition 2 will be described. FIG. 12 is a graph showing a relationship between the reflectance in visible light bands and the height b of the projection 12. The cases where the heights b of the projection 12 are 10 nm, 50 nm, 100 nm, 150 nm and 200 nm (width a is fixed) are here shown. When the height b of the projection 12 is smaller than 50 nm, the reflectance largely changes and the anti-reflection effect of the anti-reflection sheet 10 is impaired. On the other hand, when the height b of the projection 12 is larger than 400 nm, the projection 12 is weakened, and the wear-resistance and pressure-resistance become poor. Accordingly, in order to display the low reflection property of the anti-reflection sheet 10, it is preferred that the height b of the projection 12 is 50 nm or more and 400 nm or less as indicated by Condition 2.

Figure 13:
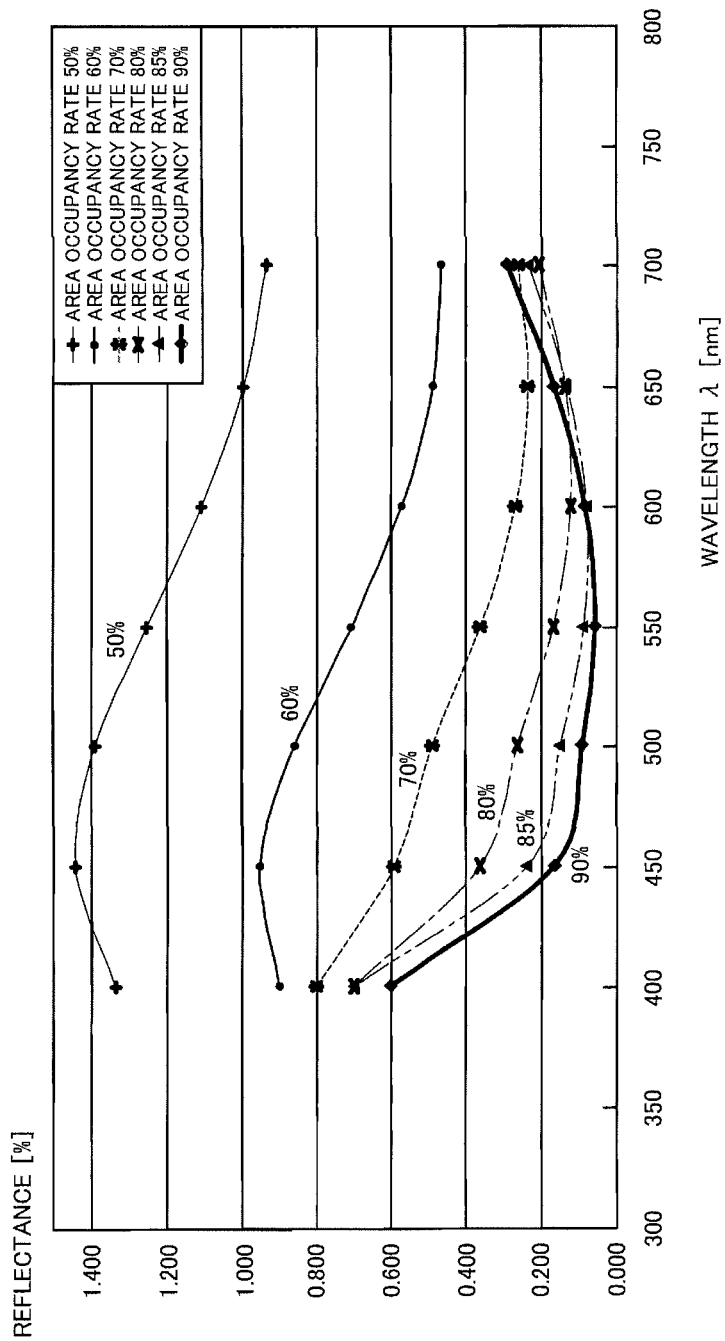
FIG. 13 is a graph showing the change in the reflectance when an area occupancy rate of the projections is changed.

Next, the reason for Condition 4 will be described. FIG. 13 shows the reflectance in visible light bands of the anti-reflection sheet 10 in which projections 12 each having an aspect ratio of less than 1 and the quadratic function-shaped cross section are provided. However, it is shown that the cases were compared where the projections 12 are arranged so that the area occupancy rates are 90%, 85%, 80%, 70%, 60% and 50%. As understood from FIG. 13, the reflectance largely changes when the area occupancy rate of the projection 12 is changed between 60% and 50%. For example, when regarding a specified wavelength, the area occupancy rate is set as a horizontal axis and the reflectance is set as a vertical axis and a curve is drawn (not shown), an inflection point is shown on the curve when the area occupancy rate is 60%, and a property of the reflectance largely changes when the area occupancy rate is smaller than 60%. Accordingly, in order to raise the wear-resistance and pressure-resistance of the projection 12 without lowering the optical properties, particularly, low reflectance property, of the anti-reflection sheet 10, the area occupancy rate of the projection 12 is required to be set to 60% as indicated by Condition 4.

Second Embodiment

Figure 14:
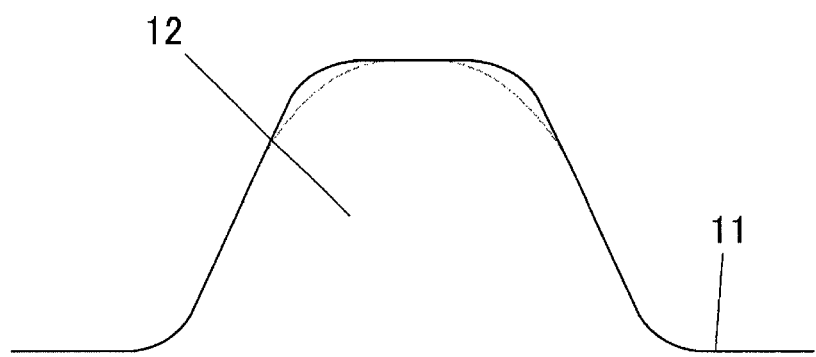
FIG. 14 is a cross sectional view showing a shape of a projection of a second embodiment of the present invention.

FIG. 14 shows a shape of a cross section of a projection 12 used for an anti-reflection sheet according to a second embodiment of the present invention. The shape of the cross section of the projection 12 is in the shape of the quadratic function (parabola) in the first embodiment. However, in the second embodiment, a tip of the projection 12 is slightly wider than that of the quadratic function and wear-resistance and pressure resistance are higher than those of the projection 12 in the first embodiment.

As shown in this example, the cross section of the projection 12 is permitted to have a shape that the quadratic function shape is slightly deformed. Deformation is permitted so long as the wear-resistance and pressure-resistance of the projection 12 are not impaired, and a correlation coefficient R of the projection 12 may be 0.8 or more (the correlation coefficient R of the quadratic function itself is 1).

The correlation coefficient R of the shape of the cross section of the projection is defined as follows: an x-axis is set perpendicularly to the surface of the substrate 11, and a y-axis is set in parallel with the surface 11 if the substrate 11 is in the cross section of the projection; many points (xi, yi) (i=1, 2, . . . , m) are properly subjected to sampling along the outline of the cross section of the projection in x-y orthogonal coordinates; and to the point set (xi, yi), the correlation coefficient R is defined by the following expression:

$$R = \frac{\sum_{i=1}^{m}(xi-\bar{x})(yi-\bar{y})}{\sqrt{\sum_{i=1}^{m}(xi-\bar{x})^2}\sqrt{\sum_{i=1}^{m}(yi-\bar{y})^2}}$$

Here, a value, a line drawn above x, represents an average value of xi, and a value, a line drawn above y, represents an average value of yi.

Figure 15:
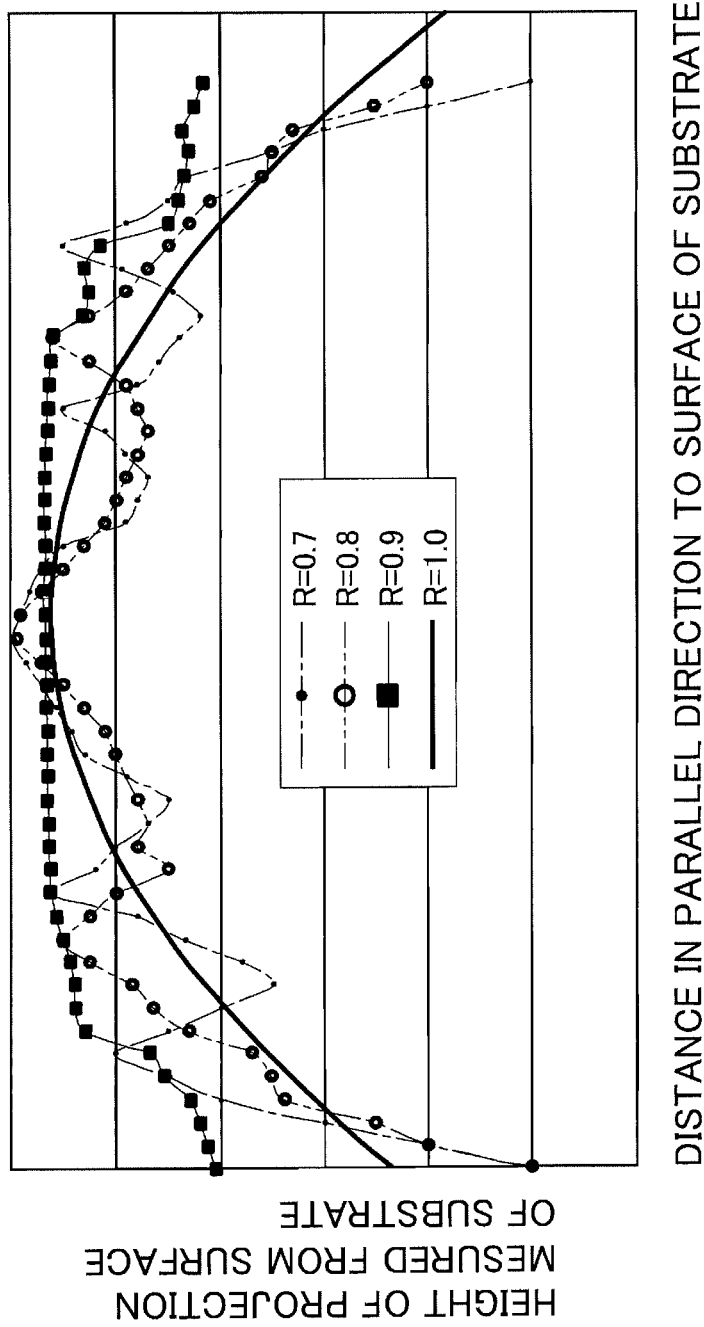
FIG. 15 is a graph showing shapes of cross sections of projections having different correlation coefficient values.

FIG. 15 shows a projection shape that the correlation coefficient R is 1 (quadratic function-shaped cross section) and three projection shapes that the correlation coefficients R are 0.7, 0.8 and 0.9. As understood from FIG. 15, fine unevenness of the surface of the projection increases and the wear-resistance lowers as the correlation coefficient R becomes small. An understood from a test result, when the correlation coefficient R is 0.8 or more, a projection shape having high wear-resistance can be obtained and a desired wear-resistance frequency can be obtained.

Third Embodiment

Figure 16:
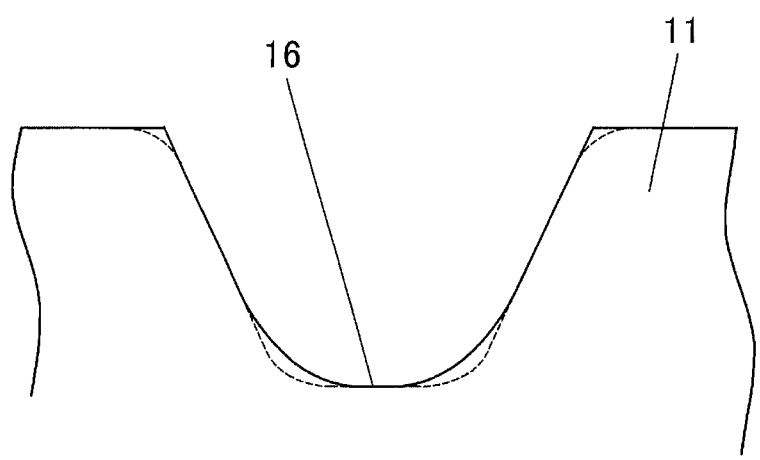
FIG. 16 is a cross sectional view showing a shape of a recess of a third embodiment of the present invention.

FIG. 16 is an explanatory view of a third embodiment of the present invention, and shows a cross section of a recess 16 having a quadratic function-shaped cross section. Although the anti-reflection sheet is adopted in the first embodiment in which the projections are formed on the substrate 11, also an anti-reflection sheet according to the third embodiment may be adopted in which the fine recesses 16 each having the quadratic functions-shaped cross section (rotational paraboloid) are closely formed. The aspect ratio and the other conditions of the projection 12 described in the first embodiment are also applied to the recess 16.

Also in the anti-reflection sheet in which the recesses 16 are formed, reflection of light can be suppressed similar to the anti-reflection sheet 10 in which the projections 12 are formed. When the recesses 16 are arranged at certain intervals, there is no possibility that the recess 16 is worn down and crushed compared with the projection 12. However, when the recesses 16 are closely formed so as to overlap each other, the recesses 16 are easily damaged by being rubbed with cloth etc., or pressed. Additionally, regarding the recess 16, projections formed on a stamper are easily worn down and crushed, but wear-resistance and pressure-resistance of the stamper are improved so long as the recess 16 has a quadratic function-shaped cross section and an aspect ratio of 1 or less.

Moreover, also in the case of the recess, the quadratic function-shaped cross section may be deformed as indicated by the broken line in FIG. 16 so long as the correlation coefficient is 0.8 or more.

Fourth Embodiment

Figure 17:
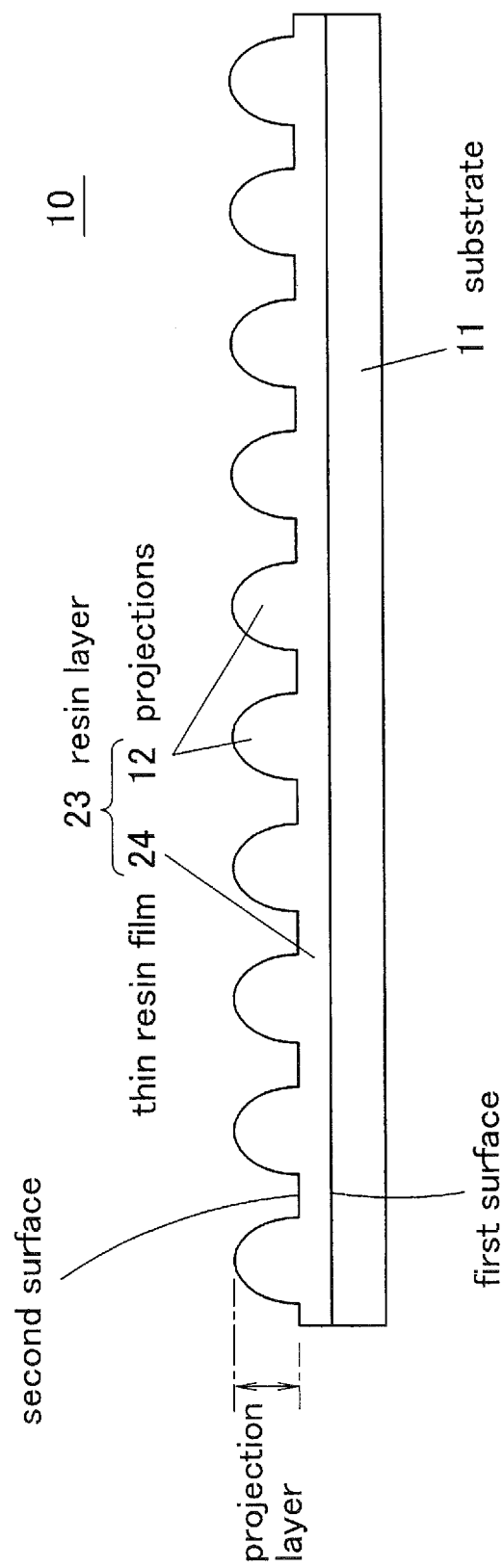
FIG. 17 is a schematic cross sectional view showing an anti-reflection sheet according to a fourth embodiment of the present invention.

FIG. 17 is a schematic cross sectional view showing an anti-reflection sheet 10 according to a fourth embodiment of the present invention. In the anti-reflection sheet 10 of this embodiment, a resin layer 23, in which a plurality of projections 12 (or recesses) are arranged, is formed on the surface of the substrate 11. Specifically, in this embodiment, the resin layer 23 formed on the substrate 11 includes the projections 12 and a thin resin film 24, the whole surface of the substrate 11 is covered with the thin resin film 24 and the projections 12 are formed on the surface of the thin resin film 24. The thin resin film 24 includes a first surface that faces the surface of the transparent substrate 11 and a second surface that faces away from the surface of the transparent substrate 11. As shown in FIG. 17, a plurality of projections 12 are arranged on the second surface of the thin resin film 24 so as to form a projection layer.

Fifth Embodiment

Figure 18:
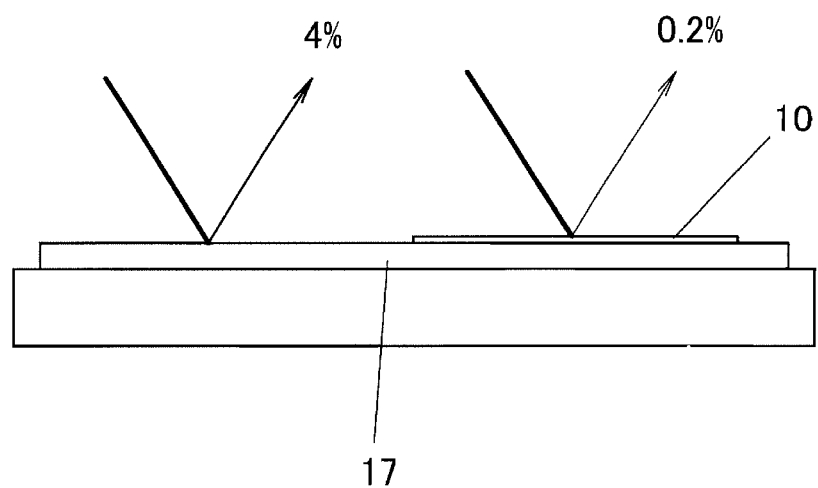
FIG. 18 is a schematic view of an organic EL.

FIG. 18 shows an organic EL 17 as a display element. Additionally, the anti-reflection sheet 10 is provided on the right half side (in FIG. 18) of a surface of the organic EL 17. Alternatively, the projections 12 may be directly formed on a surface of the organic EL 17. Since the anti-reflection sheet 10 is not provided on the left half side (in FIG. 18) of the organic EL 17, for example, 4% of incident light is reflected. However, since the anti-reflection sheet 10 is provided on the right half side, reflected light is reduced to, for example, 0.2% of incident light.

Figure 19:
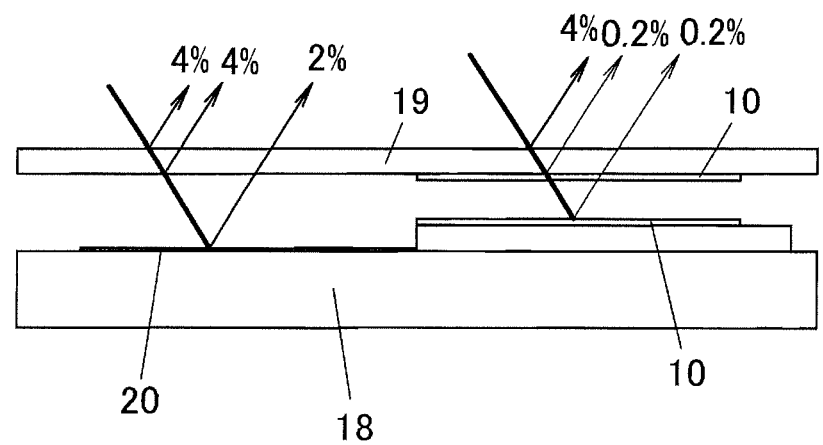
FIG. 19 is a schematic view of a liquid crystal display element.

FIG. 19 shows a liquid crystal display element as a display element. The liquid crystal display element is formed in a manner of providing a transparent protective cover 19 in front of a liquid crystal display panel 18. An AR coat 20 is conventionally provided on a surface of the liquid crystal display panel 18 on the left half side (in FIG. 19) of the liquid crystal display element. In such a structure, incident light reflects on the front and back faces of the protective cover 19 and further reflects on the surface of the liquid crystal display panel 18. When, for example, 4% of incident light reflects on each of the front and back faces of the protective cover 19 and further reflectance on the AR coat 20 is 2%, a total of 10% of the incident light is reflected.

On the other hand, on the right half side (in FIG. 19) of the liquid crystal display element, the anti-reflection sheets 10 are provided on the back face of the protective cover 19 and the surface of the liquid crystal display panel 18. In such a structure, regarding incident light, 4% of incident light reflects on the front face of the protective cover 19, 0.2% of the light is reflected on the back face of the protective cover 19 by the anti-reflection sheet 10, and 0.2% of the light is reflected also on the surface of the liquid crystal display panel 18. Therefore, a total of 4.4% of the incident light is formed into reflected light, and reflected light is reduced so as to be half of that on the left side.

Figure 20:
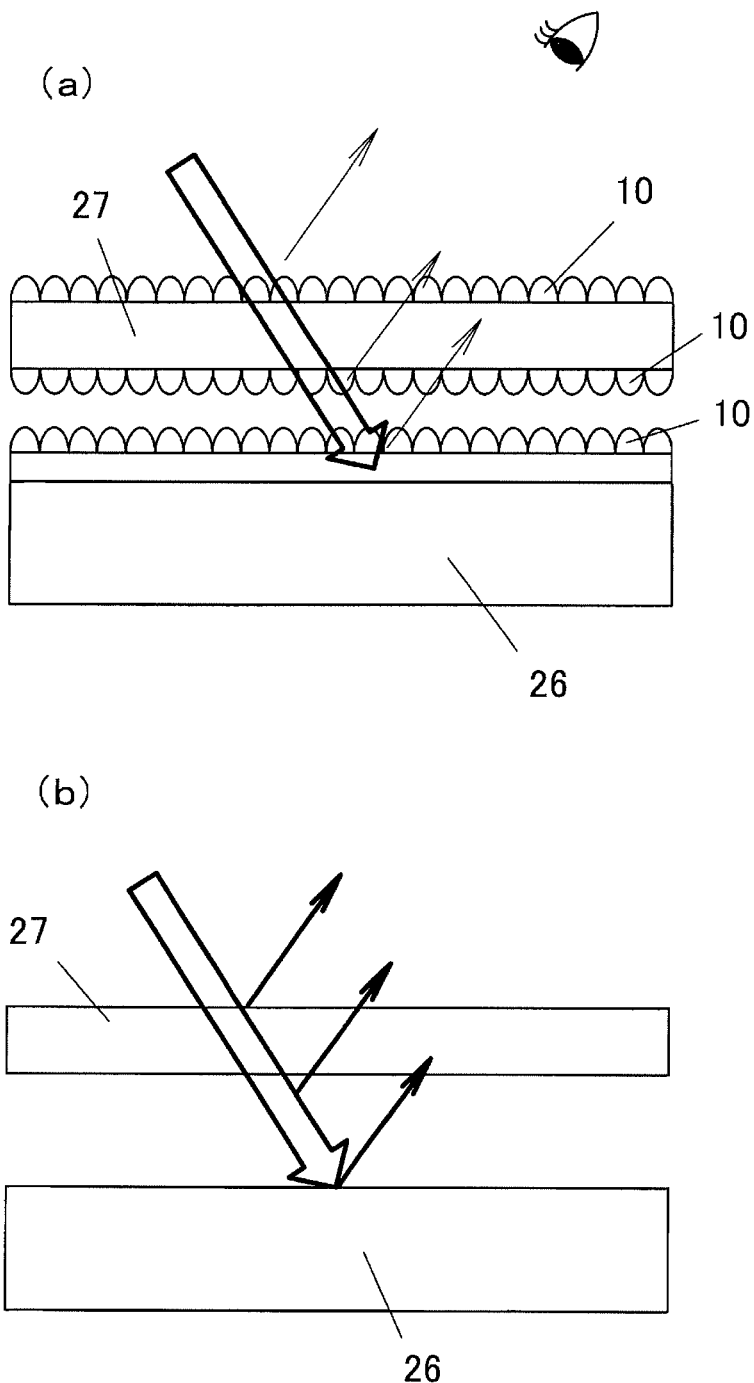
FIG. 20(a) is a schematic view of a display device including the anti-reflection sheet.
FIG. 20(b) is a schematic view of a display device including no anti-reflection sheet.

FIG. 20(a) shows a display device in which a transparent protective substrate 27 is placed in front of a display panel 26 such as a liquid crystal display (LCD) panel or organic EL, and the anti-reflection sheets 10 are provided on the front of the display panel 26 and front and back faces of the transparent protective substrate 27.

When no anti-reflection sheet 10 is used as shown in FIG. 20(b), a great amount of reflected light is generated, a total of 12% of incident light is reflected when 4% of the incident light is reflected on each face, and visibility of the display device is impaired. On the other hand, when the anti-reflection sheet 10 is provided on each face in the display device as shown in FIG. 20(a), for example, 0.2% of incident light reflects on each face, and the reflectance of the incident light is suppressed to 0.6% in total.

Since reflected light can be thus reduced by using the anti-reflection sheet (s) 10 of the present invention for an organic EL or liquid crystal display element, display device or the like, a screen of the display element such as an organic EL or liquid crystal display element, or display device is easily viewed even in a bright place such as outdoors. Additionally, since the anti-reflection sheet having the projections each having the quadratic function-shaped cross section is used, the wear-resistance and pressure-resistance of the sheet are greater than those of the anti-reflection film having conic or pyramid-shaped projections, and the optical properties (low reflection and low haze) are not impaired. Therefore, a nonreflecting structure can be provided on a surface of the display element or display device, and provided also on a surface of the protective cover or transparent protective plate of the display element or display device. By a non-reflection effect of the structure, external light is prevented from being reflected in and an effect is obtained that a display screen can be easily viewed even under external light. Additionally, surface refection of the display element, display device and an optical substrate such as a protective cover can be prevented from lowering efficiency of emitted light, and not only a light use efficiency but contrast can be improved. Additionally, since the anti-reflection sheet can be provided on a surface of equipment touchable with a cloth or the like, excellent dust-proof property and antifouling property are obtained by the projections or recesses on the surface of the anti-reflection sheet.

Sixth Embodiment

The light amount of reflected light on a surface or the like of a conventionally used display device is large. Therefore, even if an interference fringe occurs on a display face, the interference fringe is buried in the reflected light and is continually invisible to humans. However, when the anti-reflection sheet 10 of the present invention is used, the reflected light suppression effect is high and thus the latent interference fringe is visible. Particularly, since optical intensity of a specified wavelength becomes high in a spectrum of a fluorescent lamp, an interference fringe easily occurs under illumination of the fluorescent lamp. An anti-reflection sheet capable of suppressing such an interference fringe will be described below.

Figure 21:
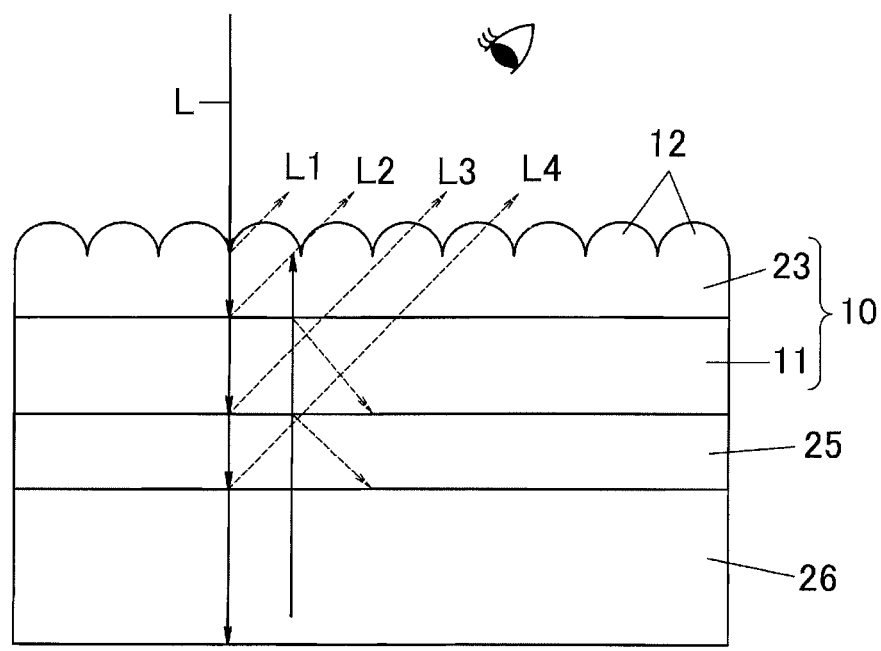
FIG. 21 is a view showing reflected light occurring on the display device.

FIG. 21 shows a display device, in which the anti-reflection sheet 10 is adhered to a surface of the display panel 26 through an adhesive layer 25 composed of adhesive, and generation of reflected light in the display device. Since incident light L partially reflects in places where the refractive index discontinuously changes, reflected lights L1 to L4 are generated on a surface of the resin layer 23, an interface between the resin layer 23 and the substrate 11, an interface between the substrate 11 and the adhesive layer 25 and an interface between the adhesive layer 25 and the display panel 26, respectively. These reflected lights L1 to L4 overlap each other thereby causing interference fringes.

[Thickness of resin layer] An interference fringe most visible among the interference fringes generated by the above-described reflected lights is generated by the reflected light L1 generated on the surface of the resin layer 23 and the reflected light L2 generated on the interface between the resin layer 23 and the substrate 11. Thereupon, focusing the thickness of the resin layer 23 and examining a difference between quantities of occurring interference fringes by using the anti-reflection sheets 10 having the resin layers 23 different in thickness, it is understood that the occurrence of an interference fringe can be efficiently suppressed when the thickness of the resin layer 23 is 11 μm or more. A method and results of this test will be described.

Figure 22:
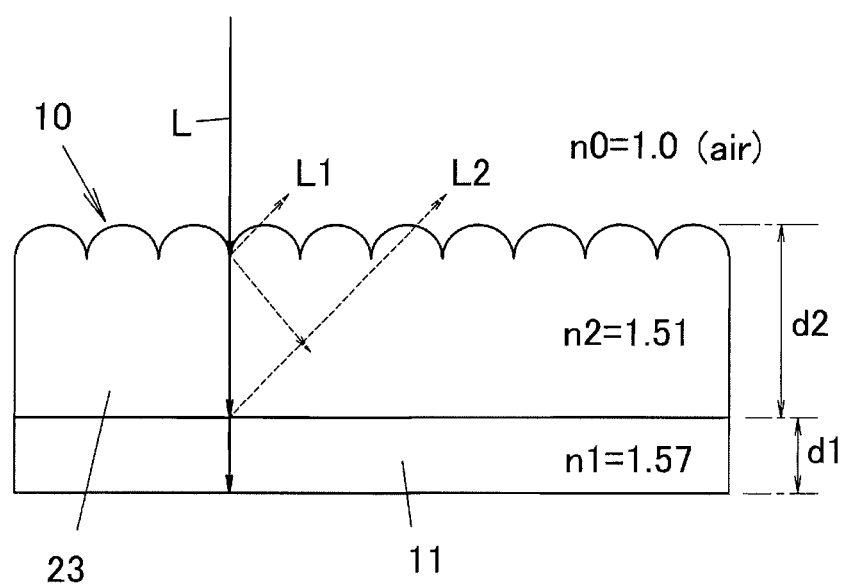
FIG. 22 is a schematic view showing an anti-reflection sheet used for evaluation of an interference fringe suppression effect.

The anti-reflection sheet 10 used for the test was formed in a manner of forming a transparent resin layer 23 having a refractive index n2 of 1.51 on a surface of a substrate 11 composed of a transparent PET film having a refractive index n1 of 1.57 and a thickness d1 of 30 μm as shown in FIG. 22. As the anti-reflection sheet 10, four resin layers 23 were prepared which have thicknesses d2 of 5 μm, 11 μm, 15 μm, and 30 μm, respectively. Then, in the case where the four kinds of anti-reflection sheets 10 were used in various forms, differences between the effects of suppressing interference fringes were examined.

Figure 23:
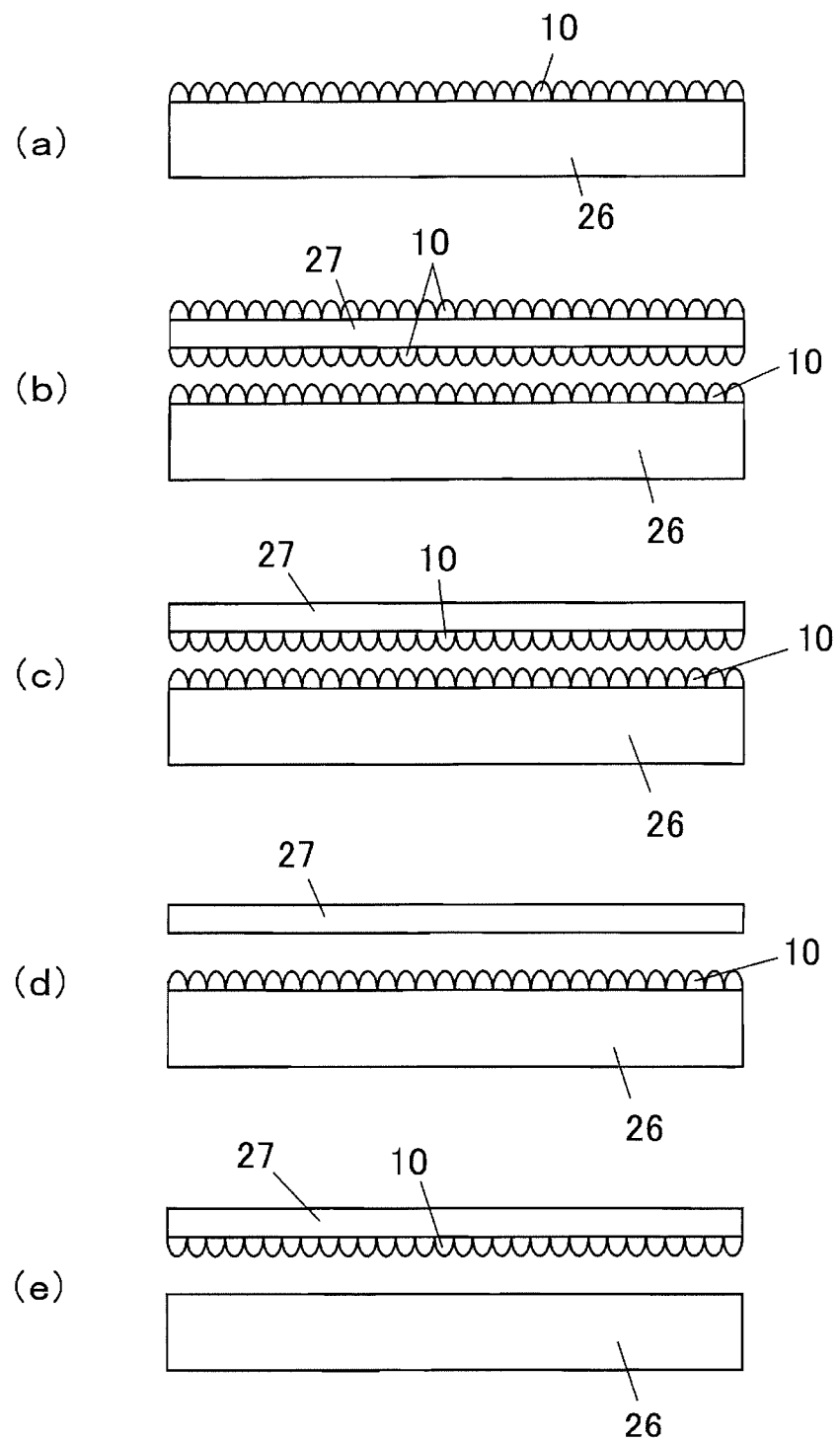
FIGS. 23(a) to (e) are schematic views showing various display devices used for evaluation of the interference fringe suppression effect.

As the use forms, five forms were examined as shown in FIGS. 23(a) to (e). FIGS. 23(a) and (b) show the anti-reflection sheets 10 provided on all light reflection faces, FIG. 23(a) shows the form that the anti-reflection sheet 10 is adhered to the surface of the display panel 26 (0.2% in total reflectance), and FIG. 23(b) shows the form that the anti-reflection sheets 10 are adhered to the surface of the display panel 26 and both the front and back faces of the transparent protective substrate 27 (0.6% in total reflectance). FIGS. 23(c), (d) and (e) show the case where the anti-reflection sheet 10 is not provided on the forefront face, FIG. 23(c) shows the form that the anti-reflection sheets 10 are adhered to the surface of the display panel 26 and the back face of the transparent protective substrate 27 (4.4% in total reflectance), FIG. 23(d) shows the form that the anti-reflection sheet 10 is adhered to only the surface of the display panel 26 and is not adhered to the transparent protective substrate 27 at all (8.2% in total reflectance), and FIG. 23(e) shows the form that the anti-reflection sheet 10 is adhered to only the back face of the transparent protective substrate 27 and is not adhered to the display panel 26 at all (8.2% in total reflectance).

Figure 24:
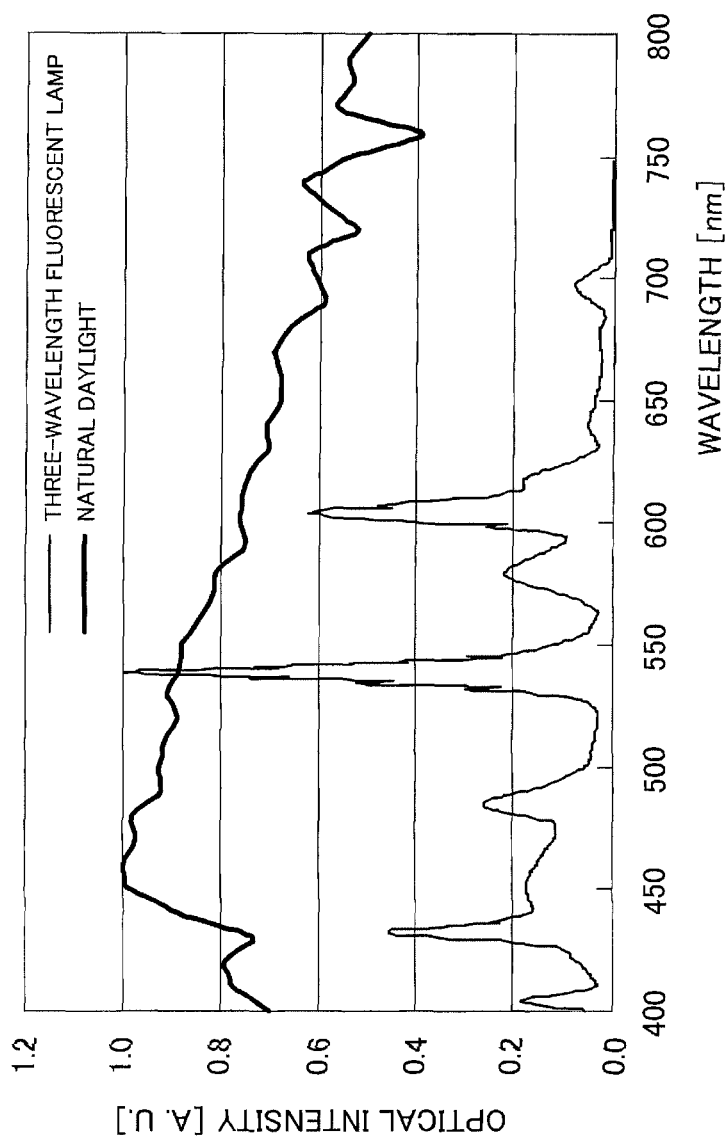
FIG. 24 is a graph showing light emission spectrums of a three-wavelength fluorescent lamp and natural daylight (sunlight) used as a light source.

As a light source for lighting the display device, a three-wavelength fluorescent lamp and natural light were used. The three-wavelength fluorescent lamp was a fluorescent tube having the light emission spectrum as shown in FIG. 24, and "Palook (EX-N)" (made by Panasonic Corporation) was used in measurement. Additionally, as natural light, natural daylight (sunlight at noon on a cloudy day having no direct sunlight) having a light emission spectrum as shown in FIG. 24 was used. Here, as shown in Table 2, when the three-wavelength fluorescent lamp was provided at a distance of 3m from the anti-reflection sheet 10, the illuminance of the anti-reflection sheet 10 was 200 lux. Additionally, in the case of natural daylight, the illuminance of the anti-reflection sheet 10 was 10,000 lux. An interference fringe was observed at a distance of 40 cm from the anti-reflection sheet in a direction tilted by 10 degrees from a direction perpendicular to the anti-reflection sheet 10.

TABLE 2

| | light source | |
|---|---|---|
| | three-wavelength fluorescent lamp | natural daylight |
| distance between light source and anti-reflection sheet | 3 m | ∞ |
| illuminance of anti-reflection sheet | 200 lux | 10,000 lux |
| viewing angle | 10 degrees | |
| distance between illuminance of anti-reflection sheet and observer | 40 cm | |

As an evaluation criterion of an interference fringe suppression effect, the effect was evaluated as "excellent" in the case where no interference fringe was visible in not only the forms shown in FIGS. 23(c) to (e) but in the forms that the anti-reflection sheets were adhered to all the light reflection faces as shown in FIGS. 23(a) and (b). Additionally, the effect was evaluated as "good" in the case where although no interference fringe was visible when the anti-reflection sheet 10 was not provided on the forefront face as shown in FIGS. 23(c) to (e), an interference fringe was visible in the form which the anti-reflection sheets 10 were adhered to all the light reflection faces as shown in FIGS. 23(a) and (b). Additionally, the effect was evaluated as "bad" in the case where an interference fringe was visible in all the forms shown in FIGS. 23(a) to (e). In other words, the interference fringe suppression effect was evaluated as "excellent" in the case where no interference fringe was visible even when the total reflectance was 1% or less, evaluated as "good" in the case where no interference fringe was visible only when the total reflectance was 4% or more, and evaluated as "bad" in the case where an interference fringe was visible in all the forms.

The results of the evaluation of the interference fringe suppression effects of the anti-reflection sheets 10 having different thicknesses are shown in Table 3.

TABLE 3

| material of substrate | PET (refractive index n1 = 1.57) | | | |
|---|---|---|---|---|
| thickness of resin layer d2 [μm] | 5 | 11 | 15 | 30 |
| evaluation of interference fringe | under fluorescent lamp | bad | good | good | good |
| | under sunlight | excellent | excellent | excellent | excellent |

In the case of the anti-reflection sheet 10 having the resin layer 23 having a thickness d2 of 5 μm, an interference fringe is visible and the effect is evaluated as "bad" so long as the three-wavelength fluorescent lamp is used even if the anti-reflection sheet 10 is adhered to any face, and there is a possibility of trouble with indoor use. On the other hand, if the anti-reflection sheet 10 having the resin layer 23 having a thickness d2 of 11 μm or more is used, although an interference fringe is visible when the anti-reflection sheets 10 are adhered to all the reflection faces and the reflectance is small, no interference fringe is visible when the anti-reflection sheets 10 are not adhered to the forefront faces, etc., as shown in FIGS. 23(c) to (e) and the reflectance is 4% or more. Consequently, it is understood that the occurrence of an interference fringe can be efficiently suppressed by setting the thickness d2 of the resin layer 23 to 11 μm or more.

[Difference between refractive indexes of substrate and resin layer] Next, occurrence of an interference fringe was examined by focusing on a difference between the refractive indexes of the resin layer 23 and the substrate 11. Consequently, it is understood that the occurrence of an interference fringe can be efficiently suppressed when a difference $\Delta n$ between the refractive index n1 of the substrate 11 and the refractive index n2 of the resin layer 23 is 0.02 or less, that is, $\Delta n=|n1-n2|\leq 0.02$. A method and results of the test will be described.

The test was performed with use of the display device shown in FIG. 21. Here, regarding the substrate 11, the thickness d1 was set to 50 μm, and the refractive indexes d1 were changed to 1.57 (PET), 1.56 (PET) and 1.49 (acryl). Regarding the resin layer 23, the refractive index n2 was set to 1.51 or 1.53, and the thicknesses d2 were changed to 5 μm and 30 μm. The anti-reflection sheet 10 was adhered to the display panel 26 by using an acryl-based or polyurethane-based adhesive layer 25 having a refractive index n3 of approximately 1.5.

The interference fringe suppression effect was evaluated similar to the case where the thickness d2 of the resin layer 23 was changed. Results of the evaluation are shown in Table 4.

TABLE 4

| material of substrate (refractive index n1) | acrylic resin (1.49) | PET (1.56) | PET (1.57) |
|---|---|---|---|
| refractive index of resin layer n2 | 1.51 | 1.53 | 1.51 |

TABLE 4-continued

| refractive index difference Δn | | 0.02 | | 0.03 | | 0.06 | |
|---|---|---|---|---|---|---|---|
| thickness of resin layer d2 [μm] | | 5 | 30 | 5 | 30 | 5 | 30 |
| Evaluation of Interference fringe | under fluorescent lamp | excellent | excellent | bad | excellent | bad | good |
| | under sunlight | excellent | excellent | excellent | excellent | excellent | excellent |

Good results were obtained in all the cases in use under sunlight. However, in the case where the difference Δn between the refractive indexes of the substrate 11 and the resin layer 23 was larger than 0.03, an interference fringe was visible regardless of the use form when the thickness d2 of the resin layer 23 was thin (d2.5 μm) in use of the three-wavelength fluorescent lamp. On the other hand, when the difference Δn between the refractive indexes of the substrate 11 and the resin layer 23 was 0.02, no interference fringe was visible regardless of the kind of light source, the thickness d2 of the resin layer 23 and the use form. Also in the case where the refractive index n2 of the resin layer 23 is smaller than 0.02, it can be estimated that no interference fringe is similarly visible. Consequently, it is understood that the occurrence of an interference fringe can be efficiently suppressed by setting the difference Δn between the refractive indexes of the substrate 11 and the resin layer 23 to 0.02 or less.

Moreover, in Table 4, the refractive index n2 of the resin layer 23 is smaller than the refractive indexes n1 of the substrate 11 except for the case where the refractive index n1 of the substrate 11 is 1.49. However, the evaluation results in Table 4 change regardless of whether the refractive indexes n1 of the substrate 11 are larger or smaller than the refractive index n2 of the resin layer 23. That is, when light is made perpendicularly incident from a medium having the refractive index n1 to a medium having the refractive index n2, the reflectance R is calculated by the following expression with use of the Fresnel formula:

$$R=|n1-n2|^2/(n1+n2)^2$$

This expression indicates when absolute value differences between the refractive indexes n1 and n2 (=Δn) equal each other, the same reflectance R is obtained regardless of whether the refractive index n1 is larger or smaller than the refractive index n2.

Additionally, the following Table 5 shows calculation results of the reflectances R in the cases where the differences Δn between refractive indexes are 0.02, 0.03, and 0.06.

TABLE 5

| refractive index of resin layer n2 | | 1.51 | |
|---|---|---|---|
| refractive index of substrate n1 (material of substrate) | 1.49 (acrylic resin) | 1.48 (acrylic resin) | 1.57 (PET) |
| refractive index difference Δn | 0.02 | 0.03 | 0.06 |
| reflectance R | 0.0044% | 0.010% | 0.038% |

Thus, when the difference Δn between the refractive indexes is 0.02 or less regardless of whether the refractive indexes n1 of the substrate 11 is larger or smaller than the refractive index n2 of the resin layer 23, the reflectance of the interface between the substrate 11 and the resin layer 23 becomes an order of a thousandth, and it is understood that an interference fringe cannot visibly be recognized.

[Difference between refractive indexes of substrate and adhesive layer] Also to the interface between the substrate 11 and the adhesive layer 25, the expression of reflectance R is applied. Accordingly, also to a relationship between the interference fringe suppression effect and a difference between the refractive indexes of the substrate 11 and the adhesive layer 25 can be considered similar to that of the substrate 11 and the resin layer 23. That is, also between the substrate 11 and the adhesive layer 25, if the difference between the refractive index n1 of the substrate 11 and the refractive index n3 of the adhesive layer 25 is smaller than 0.02, that is, |n1−n3|≤0.02, it can be said that no interference fringe is visible regardless of the kind of light source, the thickness d1 of the substrate 11 and the use form. Therefore, occurrence of an interference fringe can be efficiently suppressed by setting the difference between the refractive indexes of the substrate 11 and the adhesive layer 25, that is, |n1−n3| to 0.02 or less.

What is claimed is:

1. An anti-reflection sheet comprising:
    a transparent substrate; and
    a resin layer formed on a surface of the transparent substrate
    wherein the resin layer comprises:
        a first surface that faces the surface of the transparent substrate;
        a second surface that faces away from the surface of the transparent substrate; and
        a plurality of projections arranged on the second surface of the resin layer so as to form a projection layer,
    wherein each of the plurality of projections has a cross section that includes a predetermined center axis perpendicular to the surface of the transparent substrate,
    wherein the cross section of each of the plurality of projections is in a shape that satisfies a quadratic function,
    wherein an arranged pitch of each of the plurality of projections is not more than half of a wavelength of incident light,
    wherein a difference between a refractive index n1 of the transparent substrate and a refractive index n2 of the resin layer satisfies the following expression:

$|n1-n2|≤0.05$, wherein a thickness of the resin layer is between 11 μm and 30 μm, and
    wherein the resin layer suppresses the generation of an interference fringe under fluorescent lamps.
2. The anti-reflection sheet according to claim 1, wherein an aspect ratio of the projections is 1 or less.
3. The anti-reflection sheet according to claim 1, wherein the difference between the refractive index n1 of the transparent substrate and the refractive index n2 of the resin layer satisfies the following expression:

$|n1-n2|\leq 0.02.$

4. A display element, wherein the anti-reflection sheet according to claim 1 is provided on a surface of a display panel.

5. A display device comprising:
a display panel;
a transparent protective plate arranged opposite to a face on an image generation side of the display panel; and
an anti-reflection sheet disposed on at least one of front and back faces of the transparent protective plate,
wherein the anti-reflection sheet comprises:
a transparent substrate; and
a resin layer formed on a surface of a transparent substrate,
wherein the resin layer comprises:
a first surface that faces the surface of the transparent substrate;
a second surface that faces away from the surface of the transparent substrate; and
a plurality of projections arranged on the second surface of the resin layer so as to form a projection layer,
wherein each of the plurality of projections has a cross section that includes a predetermined center axis perpendicular to the surface of the transparent substrate,
wherein each of the plurality of projections has a cross section that is in a shape that satisfies a quadratic function,
wherein an arranged pitch of each of the plurality of projections is not more than half of a wavelength of incident light,
wherein a difference between a refractive index n1 of the transparent substrate and a refractive index n2 of the resin layer satisfies the following expression:

$|n1-n2|\leq 0.05,$ wherein a thickness of the resin layer is between 11 μm and 30 μm, and
wherein the resin layer suppresses the generation of an interference fringe under fluorescent lamps.

6. The display device according to claim 5, wherein the difference between the refractive index n1 of the transparent substrate and the refractive index n2 of the resin layer having the projections or recesses satisfies the following expression:

$|n1-n2|\leq 0.02.$

7. The anti-reflection sheet according to claim 2, wherein the aspect ratio of the projections is 0.85 or less.

* * * * *